(12) United States Patent
Ooishi

(10) Patent No.: US 6,815,785 B2
(45) Date of Patent: Nov. 9, 2004

(54) THIN FILM MAGNETIC MEMORY DEVICE AND MANUFACTURING METHOD THEREFOR

(75) Inventor: Tsukasa Ooishi, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/625,705

(22) Filed: Jul. 24, 2003

(65) Prior Publication Data

US 2004/0150016 A1 Aug. 5, 2004

(30) Foreign Application Priority Data

Jan. 30, 2003 (JP) .................................. 2003-022230

(51) Int. Cl.[7] .......................... H01L 29/82; H01L 43/00
(52) U.S. Cl. ................ 257/421; 257/295; 257/E27.006
(58) Field of Search ................ 257/421, E27.006, 257/295

(56) References Cited

U.S. PATENT DOCUMENTS 6,297,983 B1  10/2001  Bhattacharyya
6,518,588 B1 * 2/2003  Parkin et al. ................ 257/3

FOREIGN PATENT DOCUMENTS

JP  P2002-204010 A  7/2002
JP  P2002-305290 A  10/2002

* cited by examiner

Primary Examiner—David Nelms
Assistant Examiner—Tu-Tu Ho
(74) Attorney, Agent, or Firm—McDermott Will & Emery LLP

(57) ABSTRACT

A thin film magnetic memory device includes: a TMR element, provided on a main surface of a silicon substrate, operating as a memory element; a buffer layer having a first surface bringing into contact with the TMR element and a second surface, located on the side opposite to the first surface, having an area smaller than that of the first surface; and a bit line, formed of a conductor film and a barrier metal film that bring into contact with the second surface, extending in one direction so as to intersect the TMR element. Thereby, it is possible to provide a thin film magnetic memory device realizing miniaturization of the memory cell and, also, having a high reliability, and a manufacturing method therefor.

4 Claims, 30 Drawing Sheets 54  17a,18a  17b,18b  54

72a,73~75  72b,73~75  72c,73~75  72d,73~75

THIN FILM MAGNETIC MEMORY DEVICE AND MANUFACTURING METHOD THEREFOR

BACKGROUND OF THE INVENTION

1. Field of the Invention

The present invention generally relates to a thin film magnetic memory device and a manufacturing method therefor and, more particularly, to a thin film magnetic memory device having a structure for miniaturization and a manufacturing method therefor.

2. Description of the Background Art

Research concerning MRAMs (Magnetic Random Access Memories) as next-generation semiconductor devices has been performed in recent years. A so-called one transistor-one MTJ (magnetic tunnel junction)-type memory cell formed of a TMR (tunneling magnetoresistive) element that includes a magnetic tunnel junction (MTJ) and of a transistor for selection of a cell can be cited as an example of the configuration of the memory cell array of an MRAM. In addition, a so-called cross point-type memory cell formed of a TMR element and of a diode for selection of a cell, for example, can be cited as another example.

The memory cell of the MRAM according to a more detailed description of the structure of a one transistor-one MTJ-type memory cell includes: a transistor formed on a semiconductor substrate; a TMR element electrically connected to the transistor via a strap; a digit line extending below the TMR element, with an insulator film interposed between the TMR element located above the digit line and the digit line; and a bit line extending above the TMR element with a buffer layer interposed between the TMR element located below the bit line and the bit line. Thus, a magnetic field generated by making current flow through the digit line and through the bit line is used for changing the magnetic direction of a ferromagnetic layer, which is a free layer, forming the magnetic tunnel junction of the TMR element so that rewrite of the data of the memory cell is performed.

Such an MRAM memory cell is disclosed as a magneto-resistance element in, for example, Japanese Patent Laying-Open No. 2002-204010. The magneto-resistance element disclosed in the above literature includes: a lower electrode/base layer formed on a substrate; a fixed magnetic layer formed on the lower electrode/base layer; a middle layer formed on the fixed magnetic layer; and a free magnetic layer formed on the middle layer. The lamination film formed of these respective layers on the substrate is microscopically processed into a square, mesa-type structure having sides of from 2 $\mu$m to 10 $\mu$m.

In addition, Japanese Patent Laying-Open No. 2002-305290 can be cited as another literature that discloses a memory cell of an MRAM.

Such an MRAM memory cell is formed by performing predetermined photolithographic processes and etching processes. When errors at the time of exposure in photolithographic processes are taken into consideration, however, the width of a strap located in a lower layer, for example, must be greater than the width of a TMR element located in a layer above this strap in order to prevent a shift of lamination structural elements, one on top of the other, that bring into contact with each other at the time of formation. In such a case, it becomes necessary to make the layout area for memory cells large enough to include a margin and a problem arises wherein miniaturization of memory cells cannon be achieved.

In addition, in the case where a TMR element located in a lower layer and a bit line located in a layer above this TMR element, for example, shift each other due to error at the time of exposure in a photolithographic process when they are formed, a condition results in that the contact area between the TMR element and the bit line varies depending on the memory cell. In such a case, the resistance value of the contact portion between the TMR element and the bit line varies depending on the memory cell. Thus, this causes dispersion in the read current at the time of read-out of data from memory cells.

In addition, in the magneto-resistance element disclosed in Japanese Patent Laying-Open No. 2002-204010, a lamination film formed of a free magnetic layer and the like formed on a substrate, that is, the TMR element portion of a memory cell, is processed into a mesa-type structure. In this case, however, the area of the fixed magnetic layer and the area of the free magnetic layer, which sandwich the middle layer, undergo dispersion, depending on the form of the mesa-type structure portion. In addition, a process for forming the mesa-type structure is performed on this lamination film primarily by means of wet etching in order to completely prevent defects such as short circuiting between adjacent TMR elements. It becomes difficult to control the formation of the mesa-type structure in the case, in particular, wherein a wet etching process is used and, therefore, it is considered that dispersion in the area of the fixed magnetic layer and in the area of the free magnetic layer, which sandwich the middle layer, becomes large.

Such dispersion greatly affects the rewrite characteristics of the MRAM. In addition, the contact area between the middle layer and the fixed magnetic layer, as well as the contact area between the middle layer and the free magnetic layer, vary depending on the form of the mesa-type structure and, therefore, the resistance characteristics also vary. Thus, the read current flowing through the TMR element varies and, therefore, the risk arises that read-out errors may be caused at the time of the determination of the 1 or 0 of the data stored in a memory cell based on the read current.

SUMMARY OF THE INVENTION

It is therefore an object of the present invention to solve the above described problem and to provide a thin film magnetic memory device realizing miniaturization of memory cells and, also, having a high reliability, and a manufacturing method therefor.

A thin film magnetic memory device according to the present invention includes: a magnetic memory cell, provided on a main surface of a semiconductor substrate, operating as a memory element; a buffer layer having a first surface bringing into contact with the magnetic memory cell and a second surface, located on the side opposite to the first surface, having an area smaller than that of the first surface; and a wire extending in one direction so as to intersect the magnetic memory cell and so as to bring into contact with the second surface.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the drawings.

First Embodiment

Figure 1:
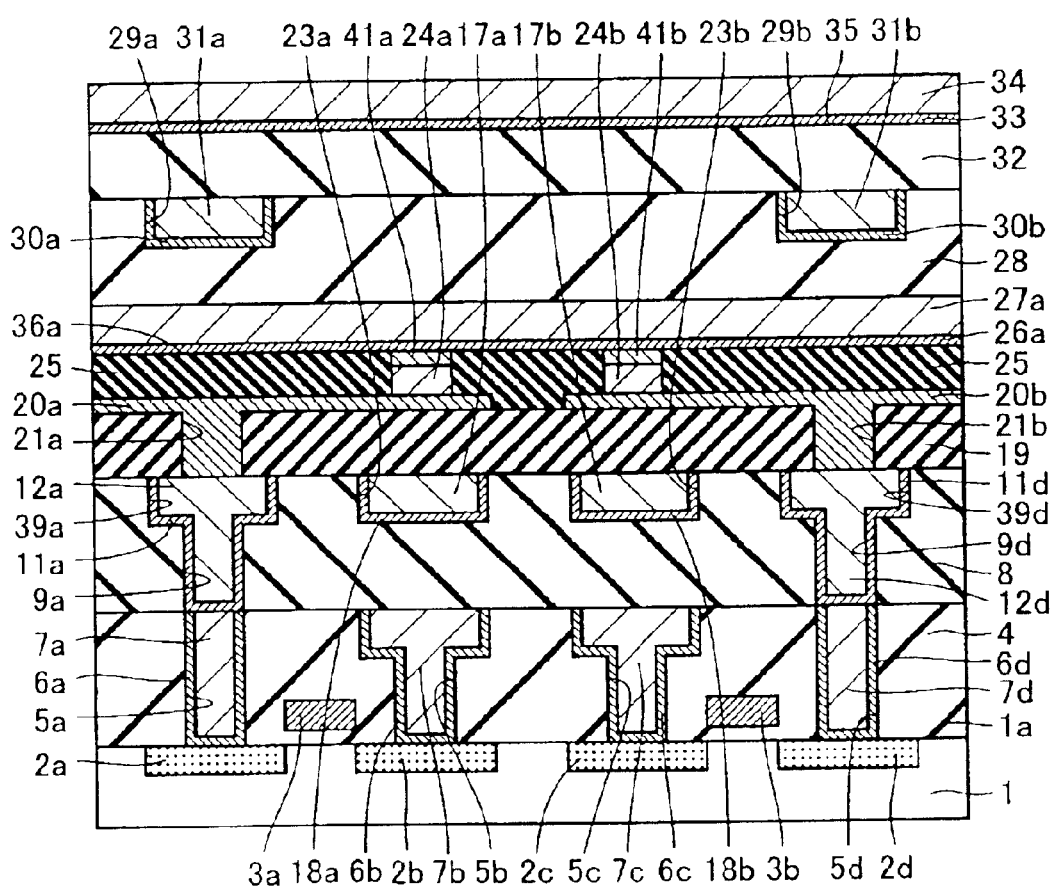
FIG. 1 is a cross sectional view showing a thin film magnetic memory device according to a first embodiment of the present invention.

FIG. 1 shows a memory cell region of a thin film magnetic memory device. Two one transistor-one MTJ-type memory cells of an MRAM (Magnetic Random Access Memory) are formed in this memory cell region.

With reference to FIG. 1, source/drain regions 2a to 2d are formed on a main surface 1a of silicon substrate 1. A gate electrode 3a is formed above silicon substrate 1, located between source/drain regions 2a and 2b, with a gate insulating film, not shown, interposed therebetween. Source/drain regions 2a and 2b, gate electrode 3a and the gate insulating film form one field-effect transistor. Similarly, a gate electrode 3b is formed above silicon substrate 1, located between source/drain regions 2c and 2d, with a gate insulating film, not shown, interposed therebetween. Source/drain regions 2c and 2d, gate electrode 3b and the gate insulating film form another field-effect transistor. Gate electrodes 3a and 3b are formed of polysilicon, lamination films of polysilicon and CoSi, WSi or the like.

An interlayer insulating film 4 is formed of a silicon oxide film and covers main surface 1a of silicon substrate 1 as well as gate electrodes 3a and 3b. Contact holes 5a to 5d are formed in interlayer insulating film 4 so as to reach to source/drain regions 2a to 2d, respectively. Source/drain regions 2a to 2d define the bottom surfaces of contact holes 5a to 5d. Contact holes 5b and 5c, starting from the top surface of interlayer insulating film 4, are formed so as to extend in the direction perpendicular to the surface of the paper of FIG. 1.

Barrier metal films 6a to 6d are formed so as to cover the inner walls of contact holes 5a to 5d. Barrier metal films 6a to 6d are formed of a barrier metal such as titanium nitride (TiN), tantalum nitride (TaN) or the like. Contact plugs 7a to 7d are formed on barrier metal films 6a to 6d so as to completely fill in the insides of contact holes 5a to 5d. Contact plugs 7a to 7d are formed of a conductive material such as copper (Cu), aluminum (Al), tungsten (W) or titanium (Ti).

An interlayer insulating film 8 is formed of a silicon oxide film on interlayer insulating film 4. A contact hole 9a is formed in interlayer insulating film 8 so as to reach to contact plug 7a and barrier metal film 6a. A contact hole 9d is formed in interlayer insulating film 8 so as to reach to contact plug 7d and barrier metal film 6d. Contact holes 39a and 39d, having diameters greater than that of contact holes 9a and 9d, are formed starting from the top surface of interlayer insulating film 8 so as to continue to contact holes 9a and 9d, respectively.

Barrier metal films 11a and 11d are formed so as to cover the inner walls of contact holes 9a and 39a as well as the inner walls of contact holes 9d and 39d, respectively. Barrier metal films 11a and 11d are formed of a barrier metal such as titanium nitride or tantalum nitride. Contact plugs 12a and 12d are formed on barrier metal films 11a and 11d so as to completely fill in the insides of contact holes 9a and 39a as well as the insides of contact holes 9d and 39d, respectively. Contact plugs 12a and 12d are formed of a conductive material such as copper, aluminum, tungsten or titanium.

Trenches 23a and 23b for wires are formed in the portions of interlayer insulating film 8 located above contact plugs 7b and 7c. Trenches 23a and 23b for wires extend in the direction perpendicular to the surface of the paper of FIG. 1. Barrier metal films 18a and 18b are formed so as to cover the inner walls of trenches 23a and 23b for wires, respectively. Barrier metal films 18a and 18b are formed of a barrier metal such as titanium nitride or tantalum nitride.

Conductor films 17a and 17b are formed on barrier metal films 18a and 18b so as to completely fill in the insides of trenches 23a and 23b for wires. The top surfaces of conductor films 17a and 17b and the top surfaces of interlayer insulating film 8 are provided in the same plane. Conductor films 17a and 17b are formed of a conductive material such as copper, aluminum, tungsten or titanium. Barrier metal film 18a and conductor film 17a formed inside of trench 23a for a wire form a first digit line in the memory cell of the MRAM. Barrier metal film 18b and conductor film 17b formed inside of trench 23b for a wire form a second digit line in the memory cell of the MRAM.

An interlayer insulating film 19 is formed of a silicon oxide film on interlayer insulating film 8. Contact holes 21a and 21b are formed in interlayer insulating film 19 so as to reach to contact plugs 12a and 12d, respectively. Straps 20a and 20b are formed so as to fill in the insides of contact holes 21a and 21b and so as to partially cover the top surface of interlayer insulating film 19. Straps 20a and 20b are separately formed. Straps 20a and 20b are formed of a conductive material such as copper (Cu), tantalum (Ta) or titanium (Ti).

Straps 20a and 20b extend on the top surface of interlayer insulating film 19 so that one end each of strap 20a and 20b reaches to the portion above the first and second digit lines, respectively. The other ends of straps 20a and 20b bring into contact with the top surfaces of contact plugs 12a and 12b inside of contact holes 21a and 21b, respectively, so as to be electrically connected to the above described field-effect transistors formed in silicon substrate 1.

TMR elements 24a and 24b are formed on the top surfaces of straps 20a and 20b so as to be located above the first and second digit lines. TMR elements 24a and 24b are magnetic memory cells including magnetic tunnel junctions. TMR elements 24a and 24b are formed of lamination films including magnetic films such as of CoFe or NiFe.

Buffer layers 41a and 41b are formed of a conductive material such as titanium (Ti) or tantalum (Ta) on top of TMR elements 24a and 24b. Herein, in FIG. 1, the detailed forms of buffer layers 41a and 41b are not shown.

In general, a buffer layer means a thin film layer positioned between a lamination film required as an original part of a memory cell and a wire at the time when the wire is connected to the lamination film from beneath or from above. In the case of a buffer layer for a wire connected from above, for example, a buffer layer made of a conductive film is placed on top of the lamination film of a memory cell for the purpose of prevention of damaging effects, such as overetching, to the lamination film of the memory cell due to etching for contact holes for bringing into contact with a wire connected from above.

An interlayer insulating film 25 is formed of a silicon oxide film so as to cover the top surface of interlayer insulating film 19 exposed from straps 20a and 20b and so as to cover straps 20a and 20b. The top surface of interlayer insulating film 25 and the top surfaces of buffer layers 41a and 41b are provided in the same plane. That is to say, TMR elements 24a and 24b as well as buffer layers 41a and 41b are formed in the condition where they are embedded in interlayer insulating film 25, and the top surfaces of buffer layers 41a and 41b are exposed from interlayer insulating film 25.

An interlayer insulating film 40, not shown, is formed of a silicon oxide film on interlayer insulating film 25. A trench 36a for a wire having a bottom defined by the top surface of interlayer insulating film 25 is formed in interlayer insulating film 40 so as to extend in the direction perpendicular to the direction in which the first and second digit lines extend. Trench 36a for a wire is formed above the top surfaces of buffer layers 41a and 41b.

A barrier metal film 26a is formed so as to cover the inner walls of trench 36a for a wire. Barrier metal film 26a brings into contact with the top surfaces of buffer layers 41a and 41b. Barrier metal film 26a is formed of a barrier metal such as titanium nitride or tantalum nitride. A conductor film 27a is formed on barrier metal film 26a so as to completely fill in the inside of trench 36a for a wire. Conductor film 27a is formed of a conductive material such as copper, aluminum, tungsten or titanium. Barrier metal film 26a and conductor film 27a formed inside of trench 36a for a wire form a first bit line in the memory cell of the MRAM.

That is to say, the first and second digit lines, formed of conductor film 17a and barrier metal film 18a as well as of conductor film 17b and barrier metal film 18b, respectively, and the first bit line, formed of conductor film 27a and barrier metal film 26a, intersect at right angles so as to sandwich TMR elements 24a and 24b. Thus, TMR elements 24a and 24b are formed at positions where the first and second digit lines and the first bit line intersect each other.

An interlayer insulating film 28 is formed of a silicon oxide film on interlayer insulating film 40. Trenches 29a and 29b for wires are formed in interlayer insulating film 28 starting from the top surface of interlayer insulating film 28. Trenches 29a and 29b for wires extend in the direction perpendicular to the surface of the paper of FIG. 1. Barrier metal films 30a and 30b are formed so as to cover the inner walls of trenches 29a and 29b for wires. Barrier metal films 30a and 30b are formed of a barrier metal such as titanium nitride or tantalum nitride. Conductor films 31a and 31b are formed on barrier metal films 30a and 30b so as to completely fill in the insides of trenches 29a and 29b for wires. Conductor films 31a and 31b are formed of a conductive material such as copper, aluminum, tungsten or titanium.

An interlayer insulating film 32 is formed of a silicon oxide film on interlayer insulating film 28. A trench 35 for a wire is formed in interlayer insulating film 32 starting from the top surface of interlayer insulating film 32 so as to extend in the direction perpendicular to the direction in which trenches 29a and 29b extend. A barrier metal film 33 is formed so as to cover the inner walls of trench 35 for a wire. Barrier metal film 33 is formed of a barrier metal such as titanium nitride or tantalum nitride. A conductor film 34 is formed on barrier metal film 33 so as to completely fill in the inside of trench 35 for a wire. Conductor film 34 is formed of a conductive material such as copper, aluminum, tungsten or titanium.

One memory cell of the MRAM shown in FIG. 1 includes: a field-effect transistor formed of gate electrode 3a as the word line, a gate insulating film, not shown, and source/drain regions 2a and 2b; strap 20a electrically connected to this field-effect transistor; TMR element 24a and buffer layer 41a formed on the top surface of strap 20a; a first digit line formed of conductor film 17a and barrier metal film 18a extending below TMR element 24a; and a first bit line formed of conductor film 27a and barrier metal film 26a extending so as to make contact with the top surface of TMR element 24a.

In addition, another memory cell of the MRAM shown in FIG. 1 includes: a field-effect transistor formed of gate electrode 3b as the word line, a gate insulating film, not shown, and source/drain regions 2c and 2d; strap 20b electrically connected to this field-effect transistor; TMR element 24b and buffer layer 41b formed on the top surface of strap 20b; a second digit line formed of conductor film 17b and barrier metal film 18b extending below TMR element 24b; and a first bit line formed of conductor film 27a and barrier metal film 26a extending so as to bring into contact with the top surface of TMR element 24b.

Figure 2:
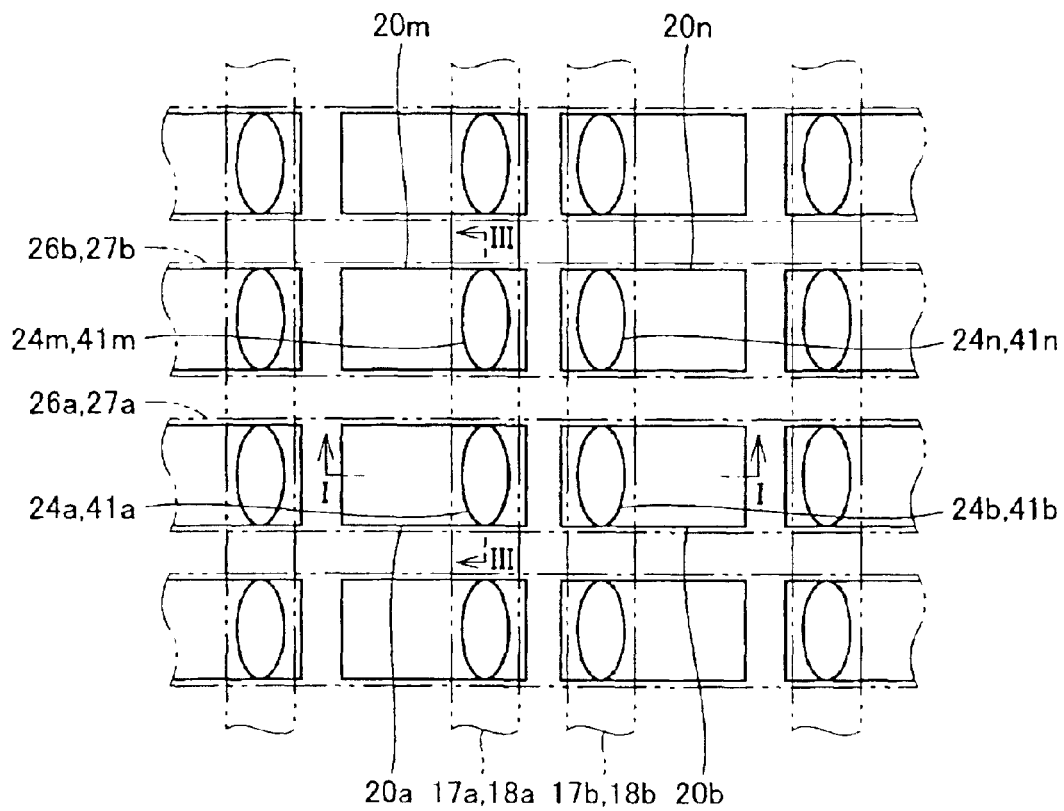
FIG. 2 is a plan view showing the thin film magnetic memory device of FIG. 1.

FIG. 2 specifically shows bit lines, digit lines, TMR elements, buffer layers and straps. FIG. 1 is a cross sectional view taken along line I—I of FIG. 2.

With reference to FIG. 2, the first bit line formed of conductor film 27a and barrier metal film 26a as well as a second bit line formed of a conductor film 27b and a barrier metal film 26b extend in the same direction and are located a predetermined distance away from each other. The first digit line formed of conductor film 17a and barrier metal film 18a as well as the second digit line formed of conductor film 17b and barrier metal film 18b extend in the direction perpendicular to the direction in which the first and second bit lines extend and are located at a predetermined distance away from each other.

Straps 20a and 20b, having rectangular forms, are formed at a predetermined distance away from each other in a region that overlaps with the first bit line. Similarly, straps 20m and 20n, having rectangular forms, are formed at a predetermined distance away from each other in a region that overlaps with the second bit line.

TMR elements 24a, 24b, 24m and 24n as well as buffer layers 41a, 41b, 41m and 41n respectively formed on these TMR elements are arranged in a matrix form at positions where the first and second bit lines as well as the first and second digit lines intersect each other. TMR elements 24a, 24b, 24m and 24n are formed in elliptical forms having long axes extending in the direction in which the digit lines extend and short axes extending in the direction in which the bit lines extend. The length of long axes of these elliptical forms is identical to the length of straps 20a, 20b, 20m and 20n in the direction in which the digit lines extend (hereinafter, also referred to as the strap width).

Figure 3:
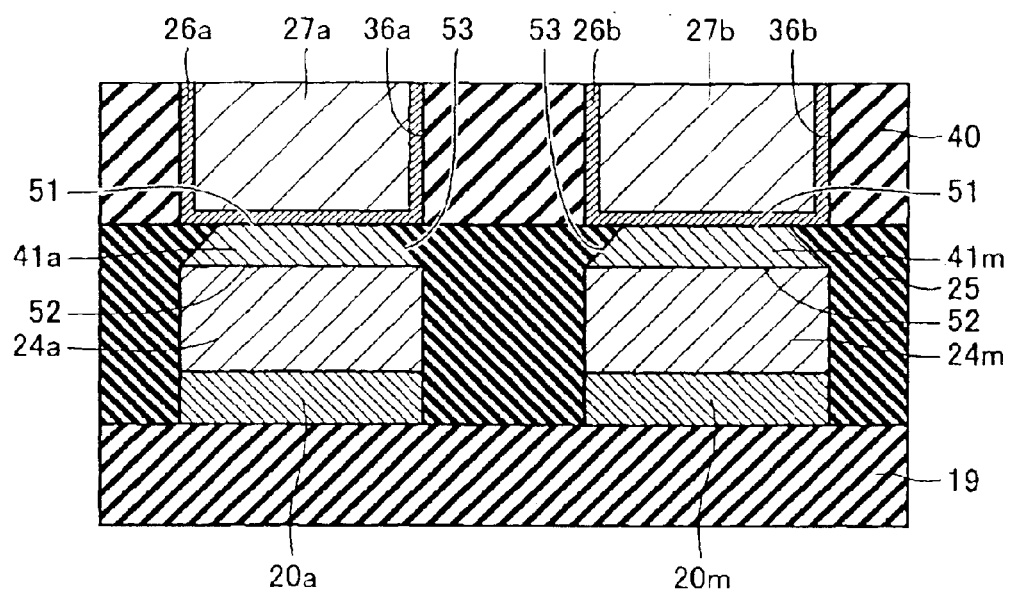
FIG. 3 is a cross sectional view taken along line III—III of FIG. 2.

With reference to FIG. 3, interlayer insulating film 40, in which trenches 36a and 36b for wires are formed, is formed on interlayer insulating film 25. TMR element 24a is formed so as to have the same width as strap 20a. In addition, TMR element 24m is formed so as to have the same width as strap 20m.

That is to say, the thin film magnetic memory device includes: first and second sidewalls facing each other, which are sidewalls extending in one direction above the main surface of a semiconductor substrate; a wire in a strip form having a top surface that continues to both the first and second sidewall; and a magnetic memory cell provided on this top surface. The magnetic memory cell has third and fourth sidewalls, respectively, continuing in the same planes to the first and second sidewalls.

Figure 4:
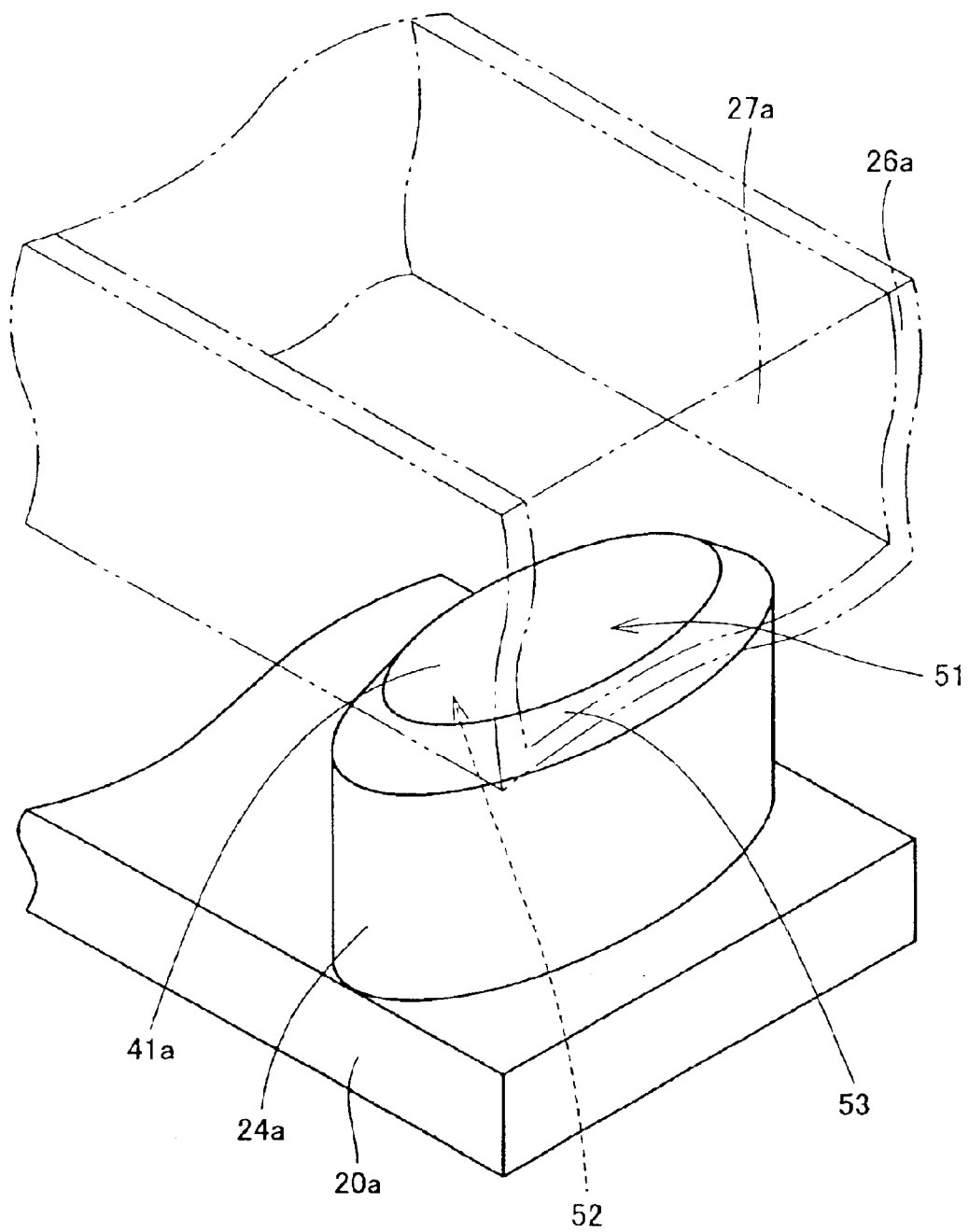
FIG. 4 is a perspective view showing a portion where a TMR element is formed in the thin film magnetic memory device of FIG. 1.

With reference to FIGS. 3 and 4, the sidewalls of buffer layers 41a and 41m are defined by inclined surfaces 53. Buffer layers 41a and 41m have: first surfaces 52 bringing into contact with TMR elements 24a and 24m; second surfaces 51, located at positions opposite to first surfaces 52, bringing into contact with barrier metal film 26a forming the first bit line and barrier metal film 26b forming the second bit line; and inclined surfaces 53 continuing from first surfaces 52 to second surfaces 51. The inclination of inclined surfaces 53 is approximately constant from the points where inclined surfaces 53 start to the points where inclined surfaces 53 reach second surfaces 51. The area of second surfaces 51 is smaller than the area of first surfaces 52.

The first and second bit lines are formed on buffer layers 41a and 41b so as to bring into contact with the entirety of second surfaces 51. The first and second bit lines are formed so as to have approximately the same widths as the widths of straps 20a and 20b.

The thin film magnetic memory device according to the first embodiment of the present invention includes: TMR element 24a as a magnetic memory cell operating as a memory element provided on main surface 1a of silicon substrate 1, as a semiconductor substrate; buffer layer 41a having first surface 52 bringing into contact with TMR element 24a, and second surface 51, located on the side opposite to first surface 52, having an area smaller than the area of first surface 52; and a first bit line formed of conductor film 27a and barrier metal film 26a, as a wire extending in one direction so as to intersect TMR element 24a and so as to bring into contact with second surface 51.

Buffer layer 41a contains at least one of titanium and tantalum. Buffer layer 41a is formed so that the cross sectional area in a plane parallel to main surface 1a of silicon substrate 1 becomes smaller as the position of the plane approaches second surface 51, starting from first surface 52.

TMR element 24a is formed so that the cross section in the plane parallel to main surface 1a of silicon substrate 1 has a circular form.

Description will be given of the operation of the memory cells of the thin film magnetic memory device shown in FIG. 1. A predetermined memory cell of the MRAM is selected by a field-effect transistor formed on silicon substrate 1. Then, appropriate currents are made to flow through the above described word line, bit line and digit line, thereby rewriting or reading data.

More specifically, currents are made to flow through a predetermined bit line and a predetermined digit line, so that a magnetic field is generated in a TMR element provided in the region where the bit line and the digit line cross each other. Thereby, the magnetic direction of the ferromagnetic layer forming the magnetic tunnel junction of the TMR element is changed so that the resistance value of the current flowing through the TMR element can be varied (tunneling magnetoresistive effect). Rewrite or read-out of data can be performed by utilizing this tunneling magnetoresistive effect.

A manufacturing method for the thin film magnetic memory device shown in FIG. 1 is described below with reference to FIGS. 5 to 21, FIGS. 23 to 29 and FIGS. 1 and 3. Here, though the manufacturing process is described with reference to the appropriate cross sectional views in the following, the same manufacturing process is performed throughout the layer even in the cross sections not referred to.

Figure 5:
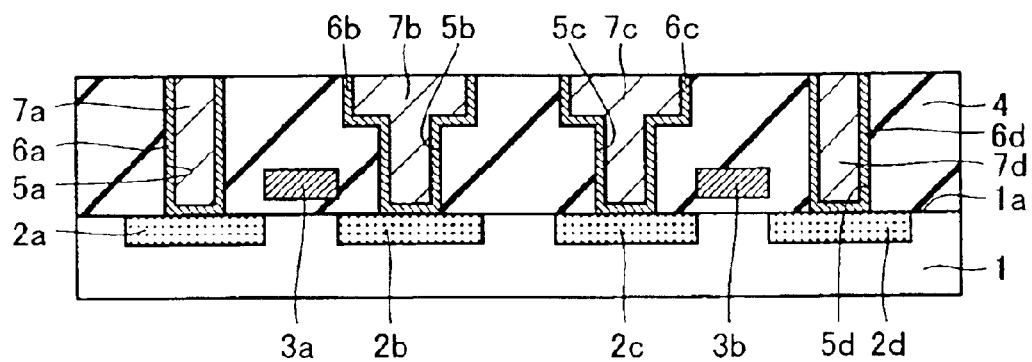
FIGS. 5 to 7 are cross sectional views showing first to third steps of a manufacturing method for the thin film magnetic memory device shown in FIG. 1.

With reference to FIG. 5, a gate insulating film, not shown, and gate electrodes 3a and 3b that are patterned into predetermined forms are sequentially formed on top of main surface 1a of silicon substrate 1. Source/drain regions 2a to 2d are formed by implanting an impurity into main surface 1a of silicon substrate 1 using gate electrodes 3a and 3b as a mask.

Interlayer insulating film 4 is formed by depositing a silicon oxide film so as to cover main surface 1a of silicon substrate 1 as well as gate electrodes 3a and 3b. Contact holes 5a to 5d are formed so as to reach to source/drain regions 2a to 2d, respectively, by performing a predetermined photolithographic process and an etching process on interlayer insulating film 4. A barrier metal and a conductive material are sequentially deposited inside of contact holes 5a to 5d as well as on the top surface of interlayer insulating film 4.

After that, the barrier metal and the conductive material are removed by means of chemical mechanical polishing (CMP) up to a level where the top surface of interlayer insulating film 4 is exposed and, at the same time, the barrier metal and the conductive material are left in contact holes 5a to 5d. Thereby, barrier metal films 6a to 6d and contact plugs 7a to 7d are formed inside of contact holes 5a to 5d.

Figure 6:
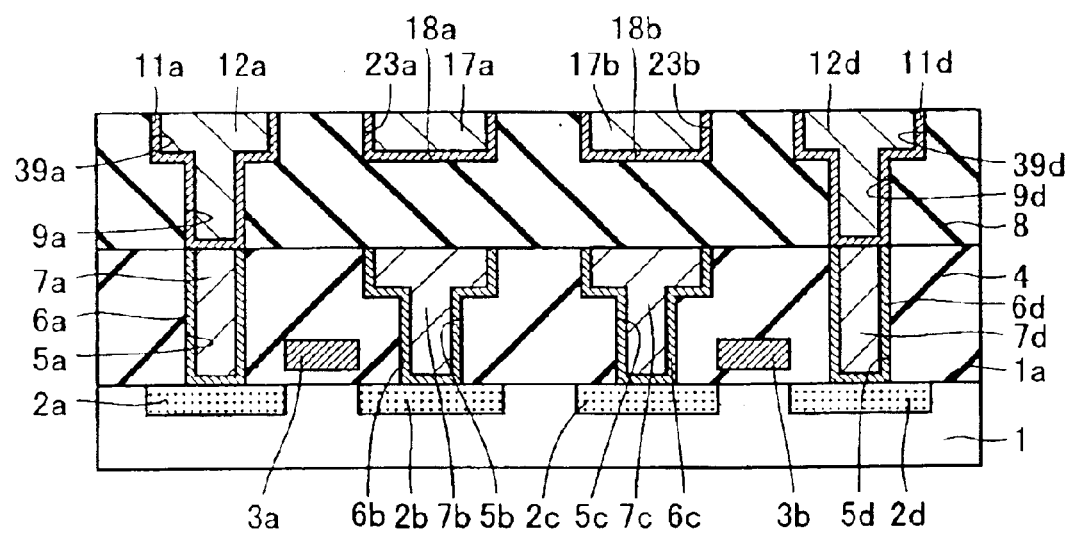

With reference to FIG. 6, interlayer insulating film 8 is formed by depositing a silicon oxide film on interlayer insulating film 4. Contact holes 9a, 9d, 39a and 39d as well as trenches 23a and 23b for wires are formed by performing a predetermined photolithographic process and an etching process on interlayer insulating film 8. A barrier metal and a conductive material are sequentially deposited inside of these contact holes and inside of the trenches for wires as well as on the top surface of interlayer insulating film 8.

After that, the barrier metal and the conductive material are removed by means of chemical mechanical polishing up to a level where the top surface of interlayer insulating film 8 is exposed and, at the same time, the barrier metal and the conductive material are left in contact holes 9a, 9d, 39a and 39d as well as in trenches 23a and 23b for wires. Thereby, barrier metal films 11a and 11d, contact plugs 12a and 12d, barrier metal films 18a and 18b as well as conductor films 17a and 17b are formed inside of the respective trenches for wires and inside of the contact holes.

Figure 7:
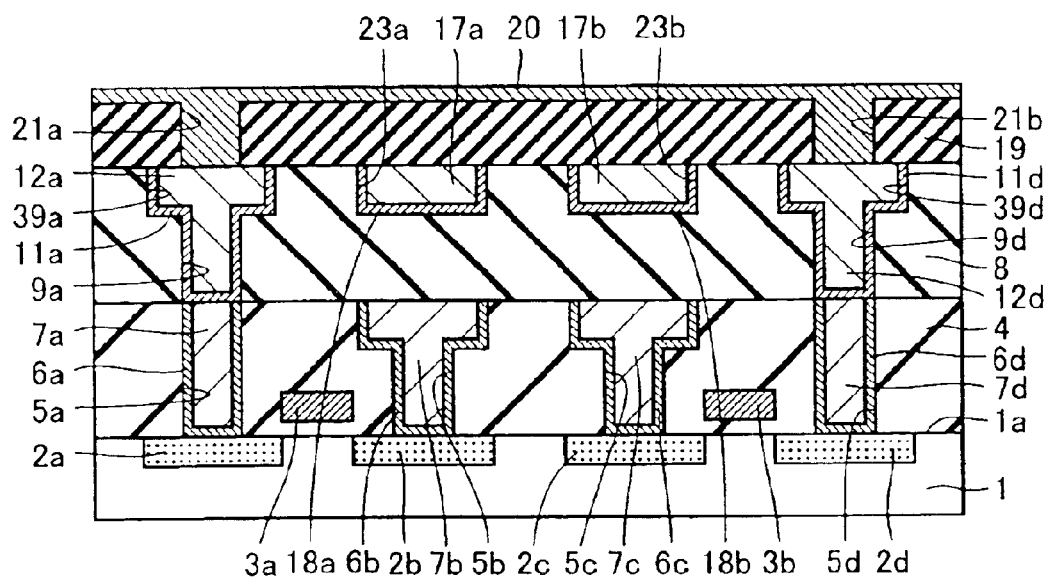
Figure 8:
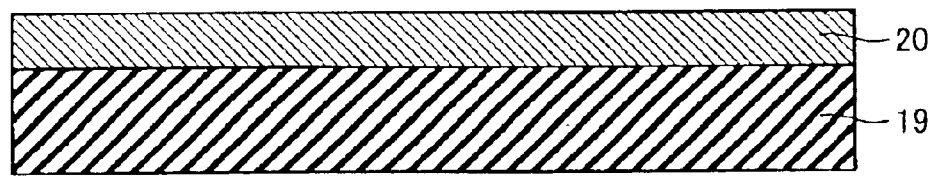
FIG. 8 is an enlarged cross sectional view showing a portion of the thin film magnetic memory device shown in FIG. 7.
Figure 9:
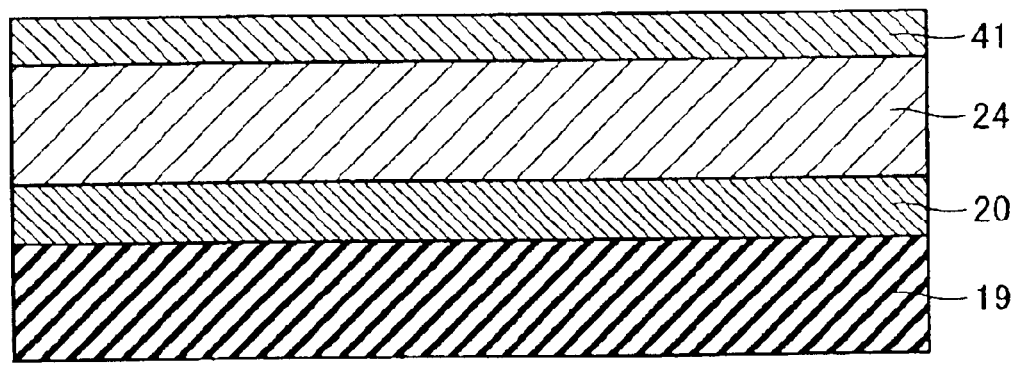
FIG. 9 is a cross sectional view showing a fourth step of the manufacturing method for the thin film magnetic memory device shown in FIG. 1.

With reference to FIG. 7, interlayer insulating film 19 is formed by depositing a silicon oxide film on interlayer insulating film 8. Contact holes 21a and 21b are formed by performing a predetermined photolithographic process and an etching process on interlayer insulating film 19. Conductive material 20 is deposited so as to fill in the insides of contact holes 21a and 21b and so as to cover the top surface of interlayer insulating film 19. FIG. 8 is a cross sectional view showing the thin film magnetic memory device at the point in time when the step shown in FIG. 7 has been completed and is a cross sectional view corresponding to the cross section taken along line III—III of FIG. 2. Next, with reference to FIG. 9, a TMR lamination film 24 and a conductive material 41 are sequentially deposited on top of conductive material 20.

Figure 10:
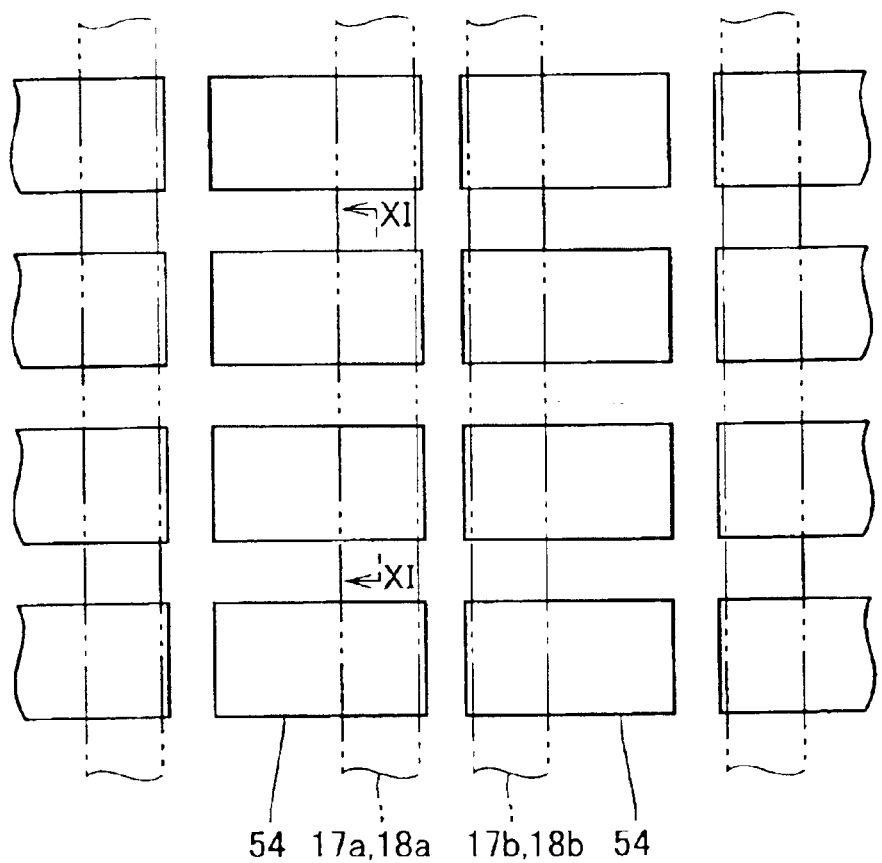
FIG. 10 is a plan view showing a fifth step of the manufacturing method for the thin film magnetic memory device shown in FIG. 1.
Figure 11:
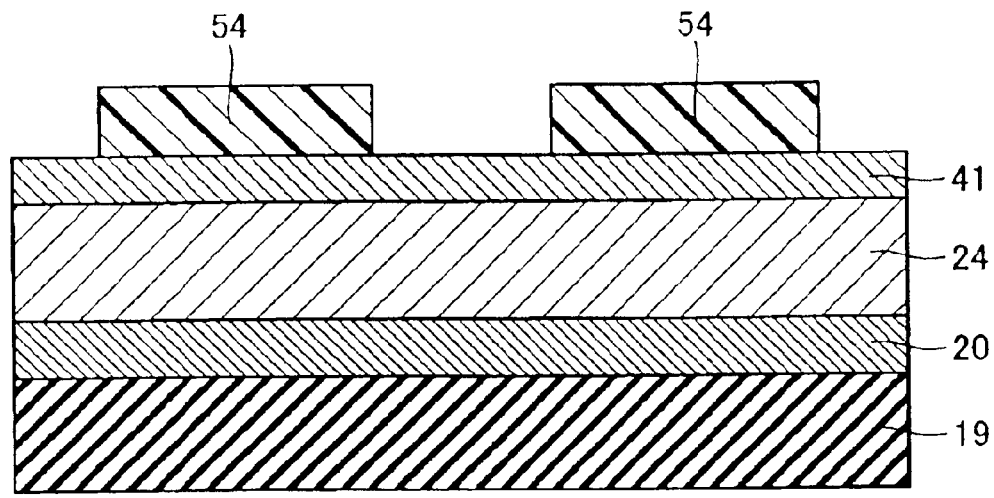
FIG. 11 is a cross sectional view taken along line XI—XI of FIG. 10.

With reference to FIGS. 10 and 11, resist films 54 in strip forms are formed on conductive material 41 so as to extend in the direction perpendicular to the direction in which the first digit line formed of conductor film 17a and barrier metal film 18a and the second digit line formed of conductor film 17b and barrier metal film 18b extend.

Figure 12:
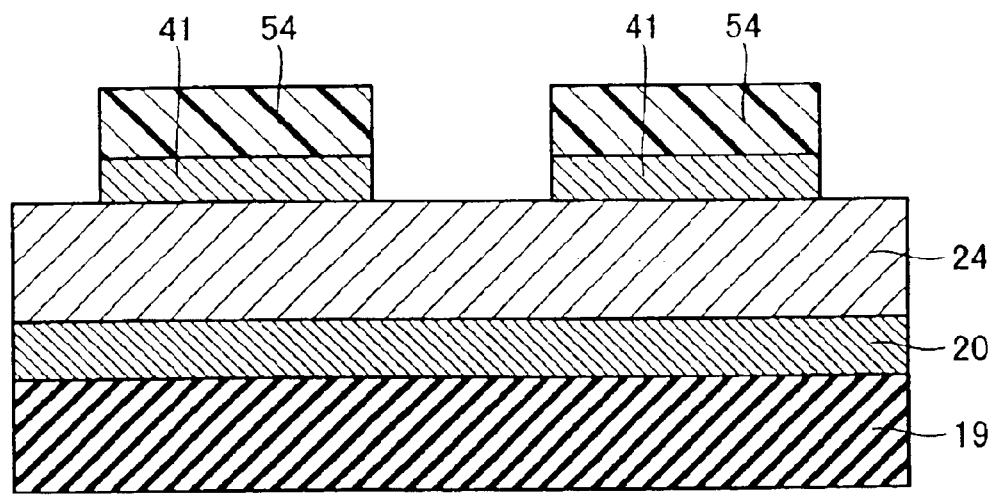
FIGS. 12 to 15 are cross sectional views showing sixth to ninth steps of the manufacturing method for the thin film magnetic memory device shown in FIG. 1.
Figure 13:
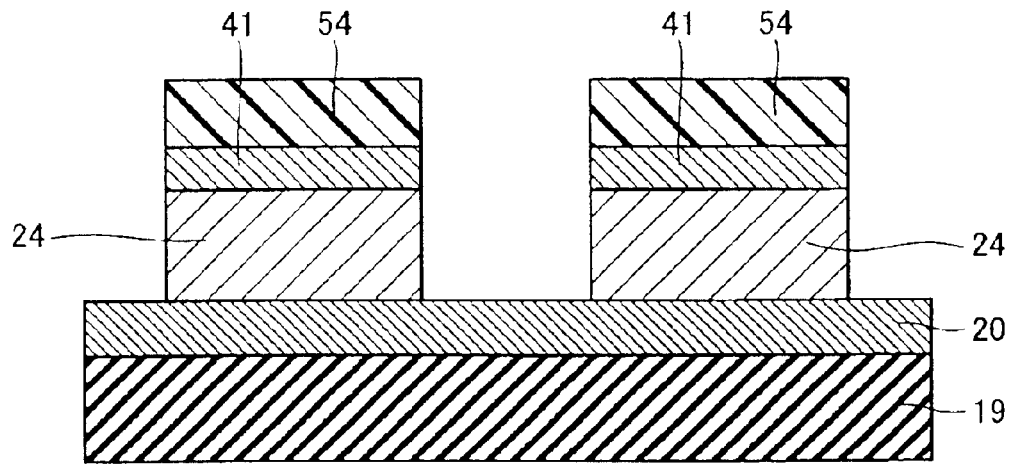
Figure 14:
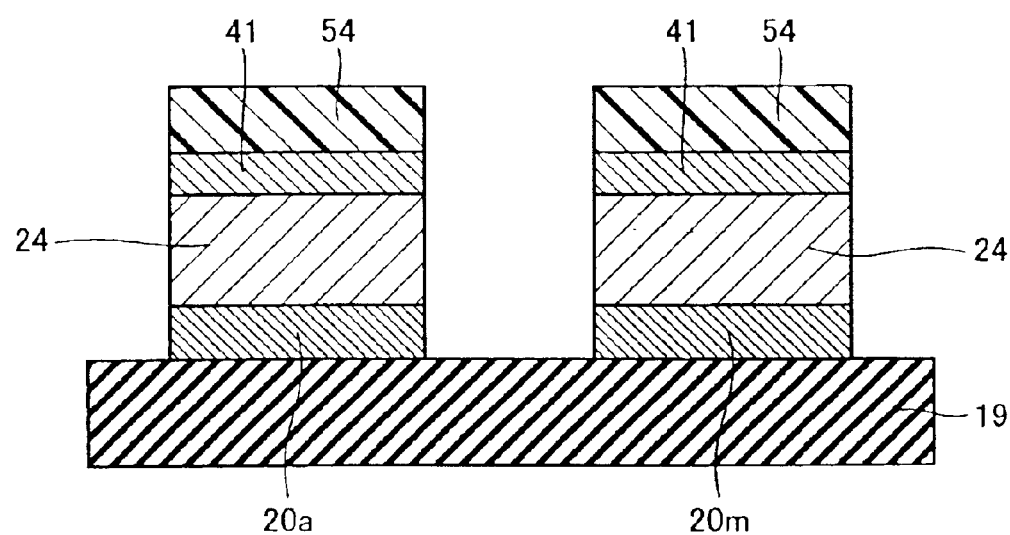

With reference to FIG. 12, etching is performed on conductive material 41 using resist films 54 as a mask. With reference to FIG. 13, etching is performed on TMR lamination film 24 using resist films 54 as a mask. With reference to FIG. 14, straps 20a and 20b are formed by performing etching on conductive material 20 using resist films 54 as a mask.

Resist films 54 are used as a mask in all of the steps shown in FIGS. 13 and 14 in the above described manner, whereby straps 20a and 20b in strip forms are formed from conductive material 20 and, at the same time, TMR lamination films 24 in strip forms having the same forms as straps 20a and 20b are provisionally formed on straps 20a and 20b.

Figure 15:
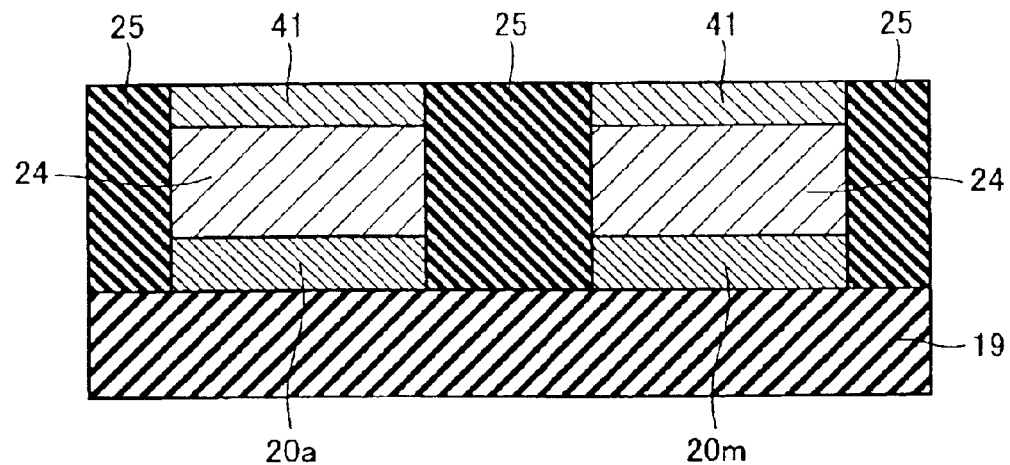

With reference to FIG. 15, resist films 54 are removed. Interlayer insulating film 25 is formed by depositing a silicon oxide film so as to fill in the trenches formed by means of etching in the steps shown in FIGS. 12 to 14 and so as to cover the top surface of conductive material 41. Interlayer insulating film 25 is removed by means of chemical mechanical polishing up to a level where the top surface of conductive material 41 is exposed.

Figure 16:
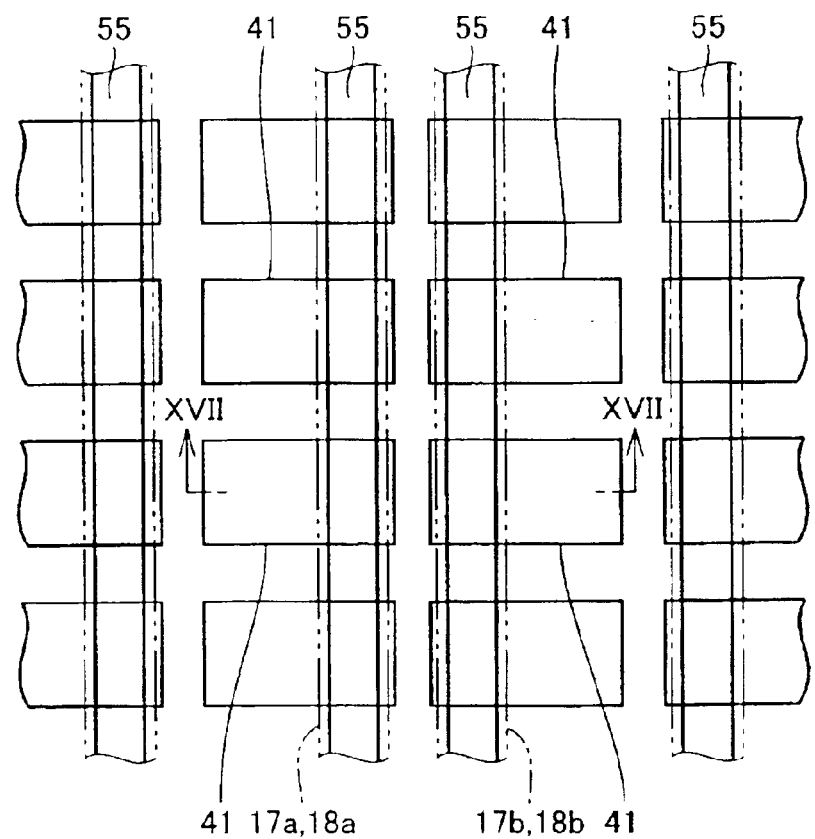
FIG. 16 is a plan view showing a tenth step of the manufacturing method for the thin film magnetic memory device shown in FIG. 1.
Figure 17:
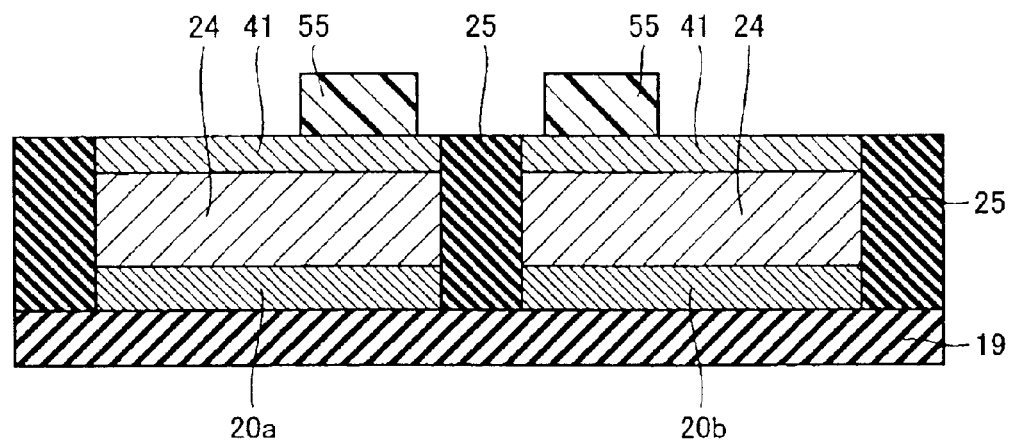
FIG. 17 is a cross sectional view taken along line XVII—XVII of FIG. 16.

With reference to FIGS. 16 and 17, resist films 55 extending in the direction in which the first and second digit lines extend are formed in regions on the top surfaces of interlayer insulating film 25 and conductive material 41, which overlap with the first and second digit lines. Resist films 55 intersect resist films 54, which were formed in the step shown in FIG. 10, at right angles. In addition, resist films 55 extend across a plurality of pieces of conductive material 41.

Figure 18:
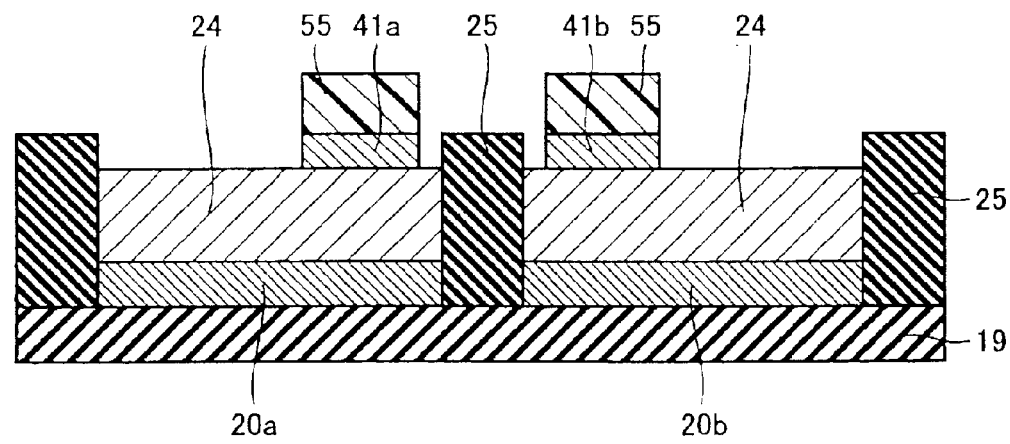
FIGS. 18 and 19 are cross sectional views showing eleventh and twelfth steps of the manufacturing method for the thin film magnetic memory device shown in FIG. 1.
Figure 19:
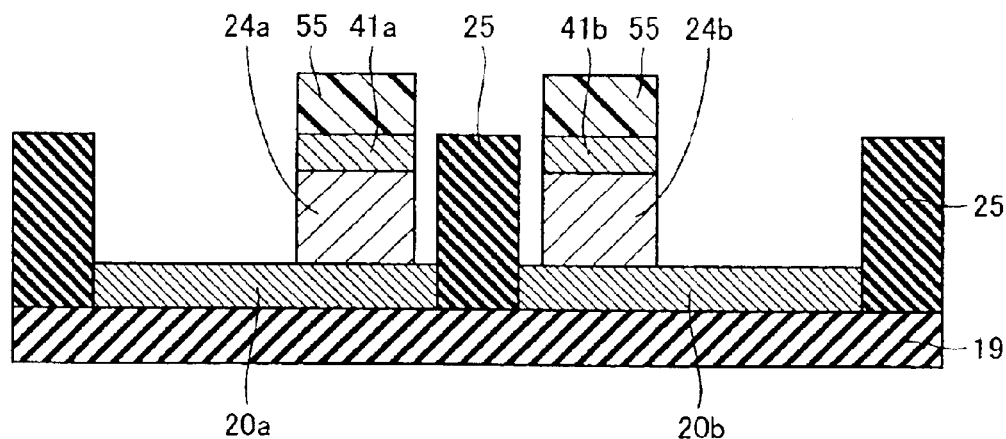

With reference to FIG. 18, buffer layers 41a and 41b are formed by etching conductive material 41 using resist films 55 as a mask. With reference to FIG. 19, TMR elements 24a and 24b are formed by etching TMR lamination films 24 using resist films 55 as a mask. At this point in time buffer layers 41a and 41b as well as TMR elements 24a and 24b are formed in rectangular forms that partially cover the top surfaces of straps 20a and 20b.

As described above, TMR lamination films 24 in strip forms are formed into TMR elements 24a and 24b in the step shown in FIG. 19. At this time, the TMR elements have already been separated for respective memory cells by means of etching using resist films 54; therefore, a process may be performed so that TMR elements having desired widths in the direction in which the straps extend are formed by means of etching using resist films 55. Therefore, the sidewalls of TMR elements 24a and 24b and the sidewalls of straps 20a and 20b, which are all formed using resist films 54 as a mask, become continuous in the same planes even after TMR elements 24a and 24b have been formed into their final forms.

Figure 20:
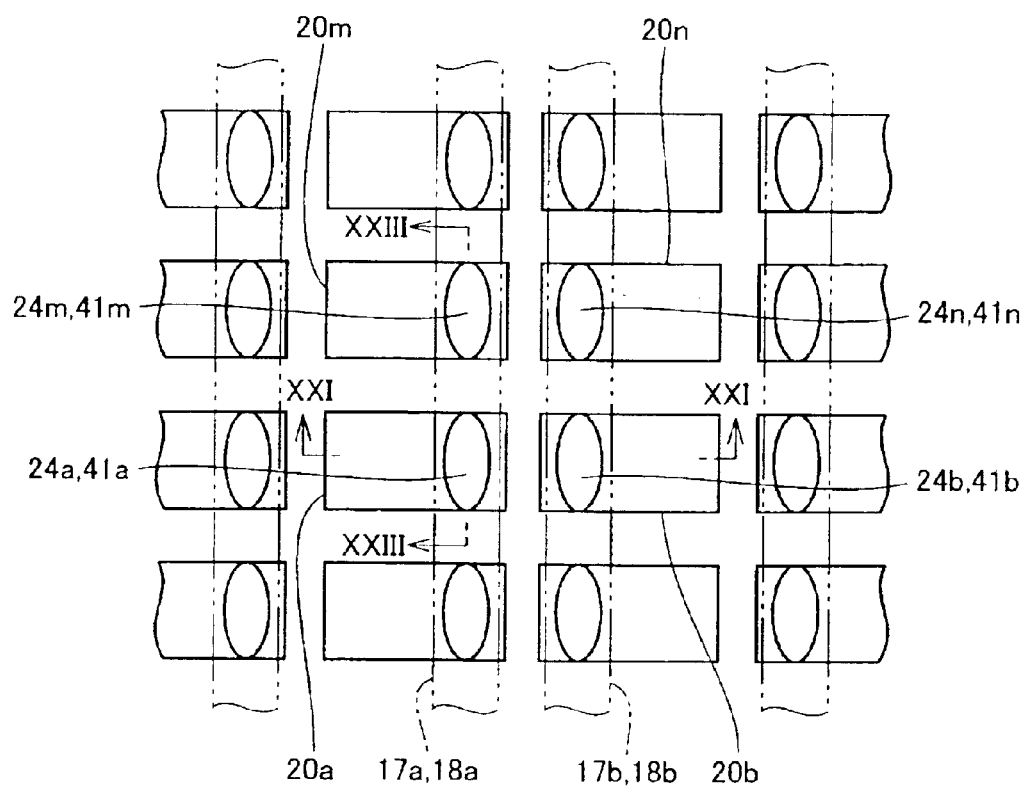
FIG. 20 is a plan view showing a thirteenth step of the manufacturing method for the thin film magnetic memory device shown in FIG. 1.
Figure 21:
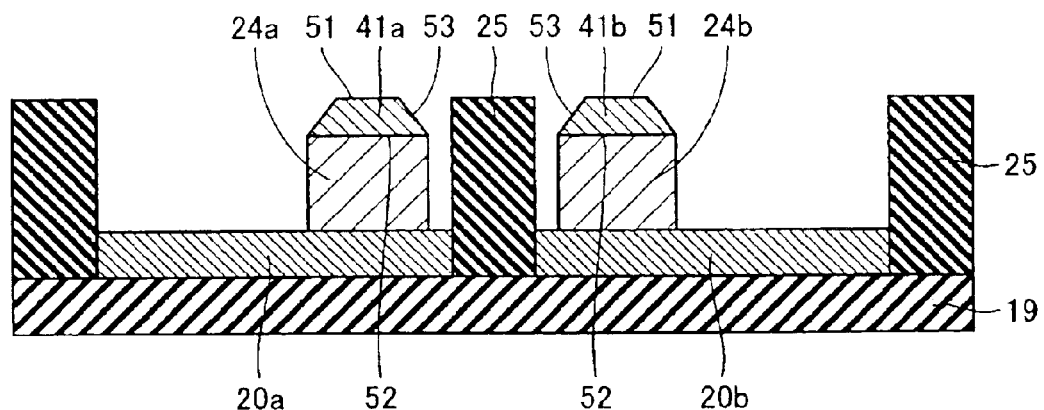
FIG. 21 is a cross sectional view taken along line XXI—XXI of FIG. 20.

With reference to FIGS. 20 and 21, resist films 55 are removed. The TMR elements and the buffer layers are isotropically etched using a predetermined etchant. When TMR elements 24a and 24b as well as buffer layers 41a and 41b formed in rectangular forms are isotropically etched, the etching rate becomes great in the top surface portions of buffer layers 41a and 41b, in the edge portions of buffer layers 41a and 41b where the top surface and the sidewalls meet and in the edge portions of the sidewalls of buffer layers 41a and 41b as well as of TMR elements 24a and 24b. Therefore, the sidewalls of TMR elements 24a and 24b as well as of buffer layers 41a and 41b are shaved so as to form a rounded shape as a whole and, at the same time, buffer layers 41a and 41b are shaved into mesa forms. Thereby, TMR elements 24a and 24b as well as of buffer layers 41a and 41b are formed into elliptical forms and, in addition, the sidewalls of buffer layers 41a and 41b are made into inclined surfaces 53.

Buffer layers 41a and 41b are formed so that the areas of the cross sections in a plane parallel to main surface 1a of silicon substrate 1 become smaller as the position of the plane approaches second surfaces 51, starting from first surfaces 52; therefore, buffer layers 41a and 41b can easily and quickly be formed into predetermined forms by means of isotropic etching.

Herein, though buffer layers 41a and 41b formed into mesa forms ranging from second surfaces 51 to first surfaces 52 are described in the present embodiment, the present invention is not limited to this. There are cases where, according to the isotropic etching conditions, portions to be shaved from the mesa form are left above first surface 52 and where even top surface portions of TMR elements 24a and 24b are slightly shaved away from the mesa form.

Figure 22:
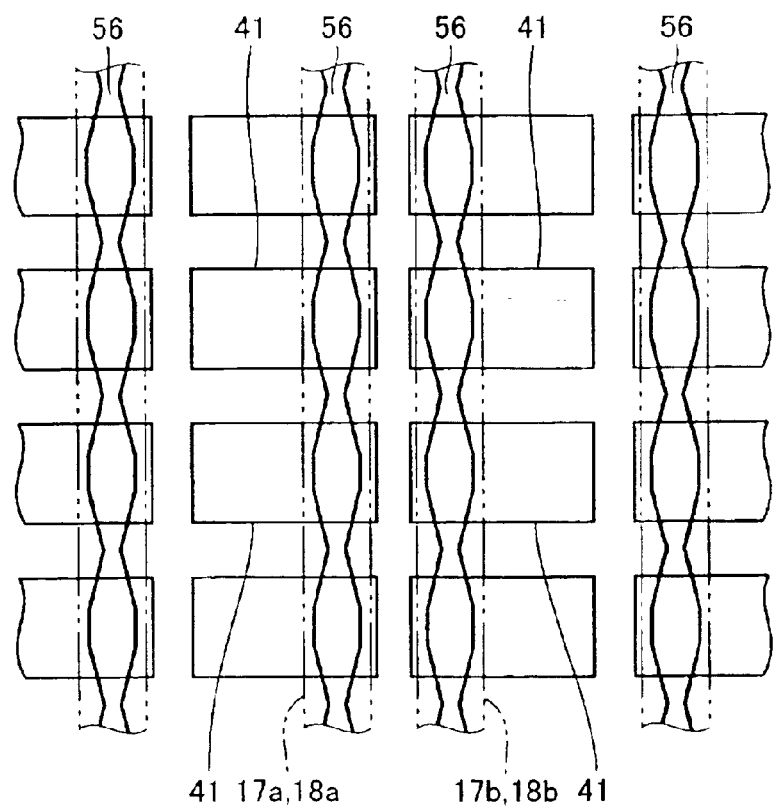
FIG. 22 is a plan view showing another resist film in place of a resist film of FIG. 16.

With reference to FIG. 22, resist films 56 may be formed in place of resist films 55 in FIG. 16 to have approximately elliptical forms in the case where it is desirable to emphasize the elliptical forms of TMR elements 24a and 24b, which are formed in the steps shown in FIGS. 20 and 21.

Figure 23:
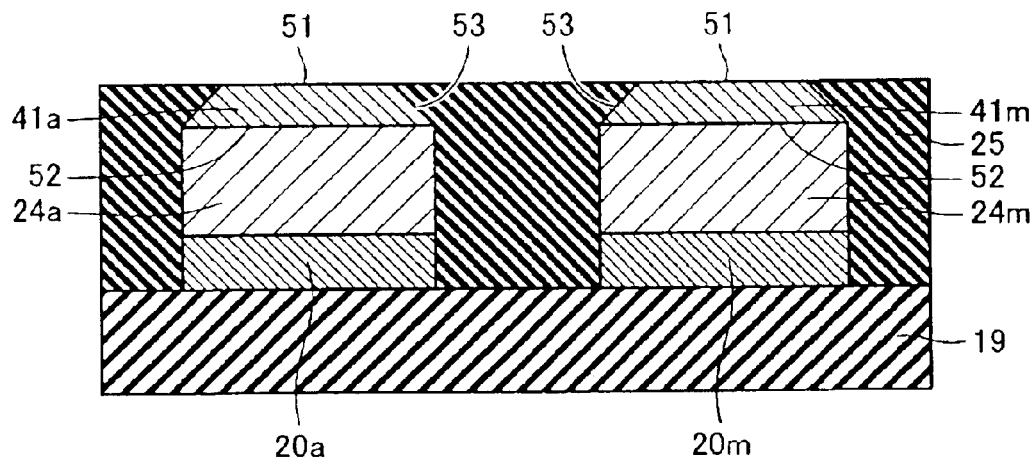
FIGS. 23 to 29 are cross sectional views showing fourteenth to twentieth steps of the manufacturing method for the thin film magnetic memory device shown in FIG. 1.

FIG. 23 is a cross sectional view corresponding to the cross section taken along line XXIII—XXIII of FIG. 20. With reference to FIG. 23, interlayer insulating film 25 is again formed by depositing a silicon oxide film so as to fill in the trenches formed by means of etching in the steps shown in FIGS. 18 and 19 and so as to cover the top surfaces of buffer layers 41a and 41m. Interlayer insulating film 25 is removed by means of chemical mechanical polishing up to a level where the top surfaces of buffer layers 41a and 41m are exposed.

Figure 24:
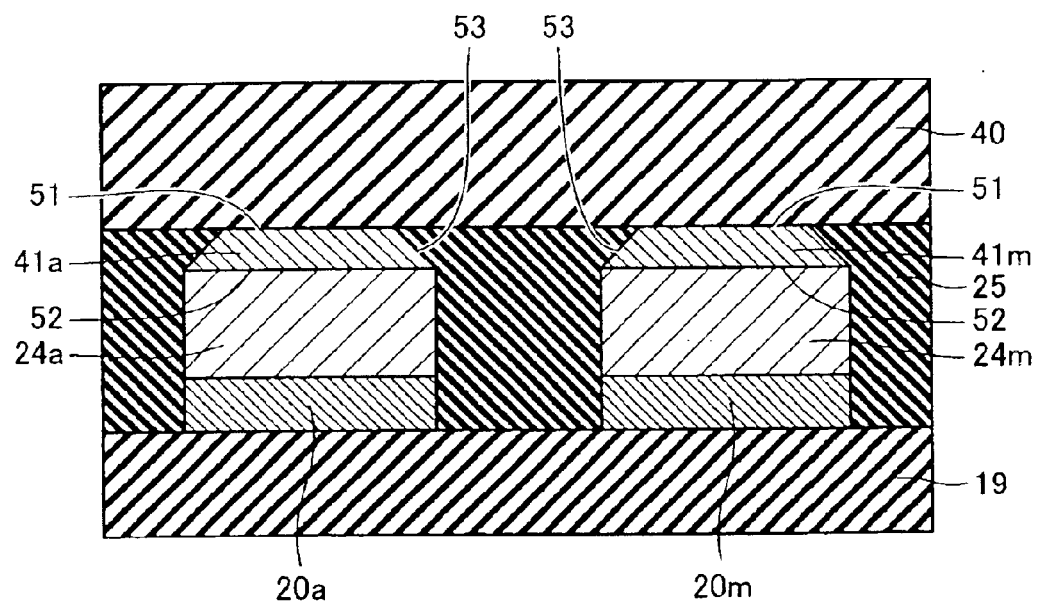
Figure 25:
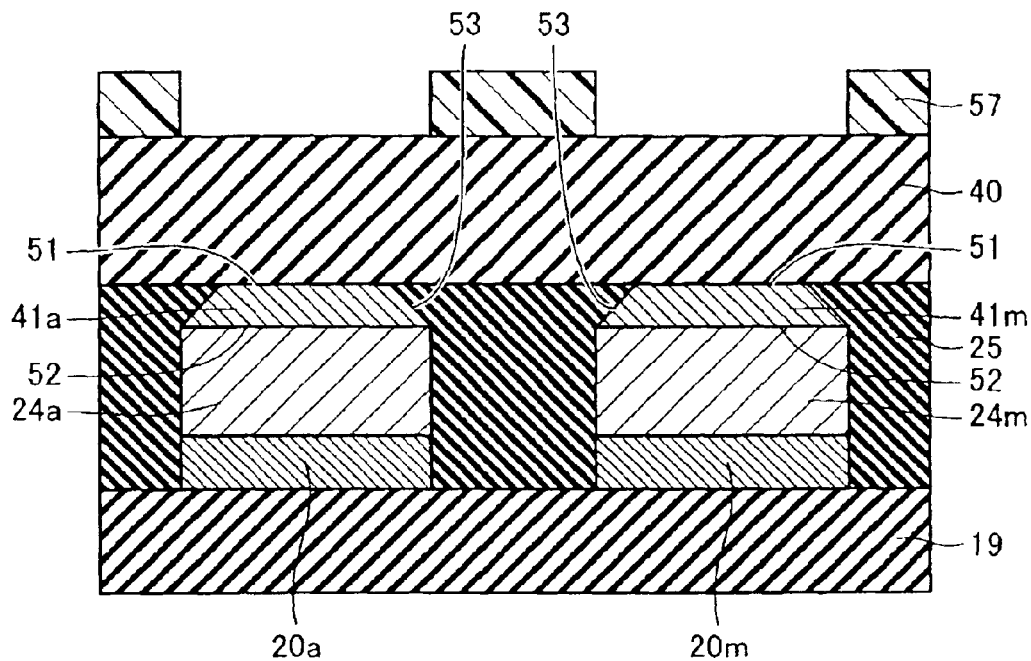
Figure 26:
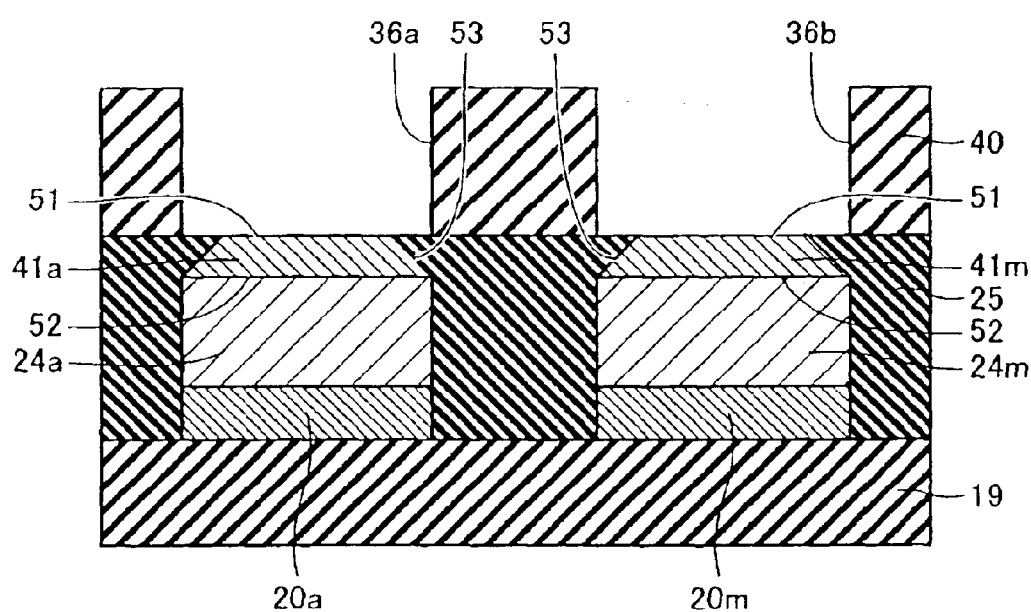

With reference to FIG. 24, interlayer insulating film 40 is formed by depositing a silicon oxide film on interlayer insulating film 25. With reference to FIG. 25, a resist film 57 having a pattern with predetermined openings is formed on interlayer insulating film 40. With reference to FIG. 26, interlayer insulating film 40 is etched using resist film 57 as a mask, so that trenches 36a and 36b for wires that reach to second surfaces 51 of buffer layers 41a and 41m are formed. After that, resist film 57 is removed.

Figure 27:
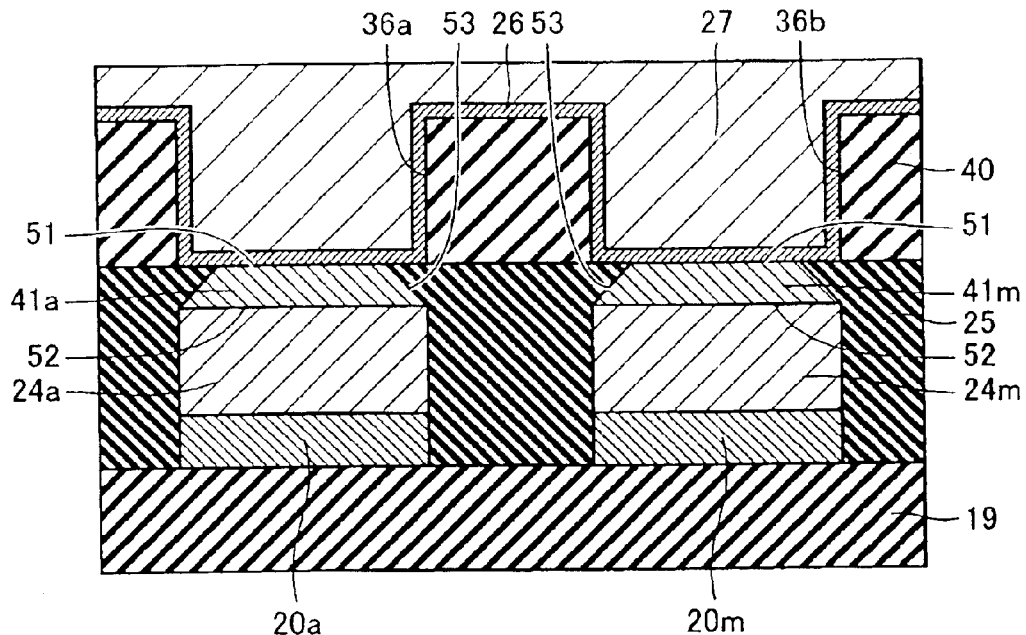
Figure 28:
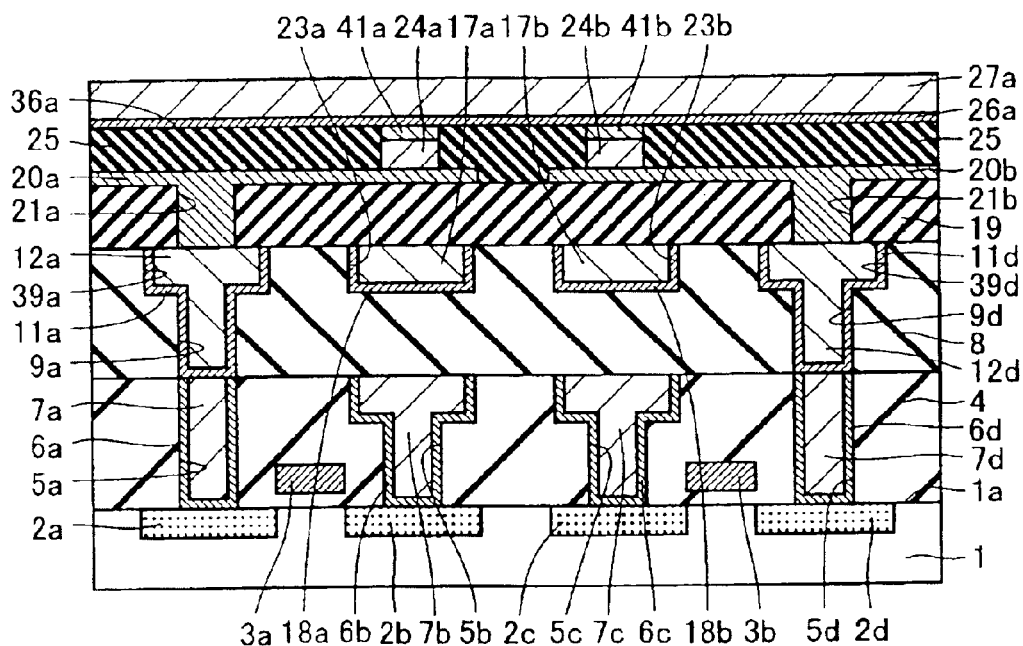

With reference to FIG. 27, barrier metal 26 and conductive material 27 are sequentially deposited inside of trenches 36a and 36b for wires as well as on the top surface of interlayer insulating film 40. FIG. 28 is a cross sectional view corresponding to the cross section shown in FIG. 1. With reference to FIGS. 3 and 28, barrier metal 26 and conductive material 27 are removed by chemical mechanical polishing up to a level where the top surface of interlayer insulating film 40 is exposed and, at the same time, the barrier metal and the conductive material are left in trenches 36a and 36b for wires. Thereby, barrier metal films 26a and 26b as well as conductor films 27a and 27b are formed inside of trenches 36a and 36b for wires.

Figure 29:
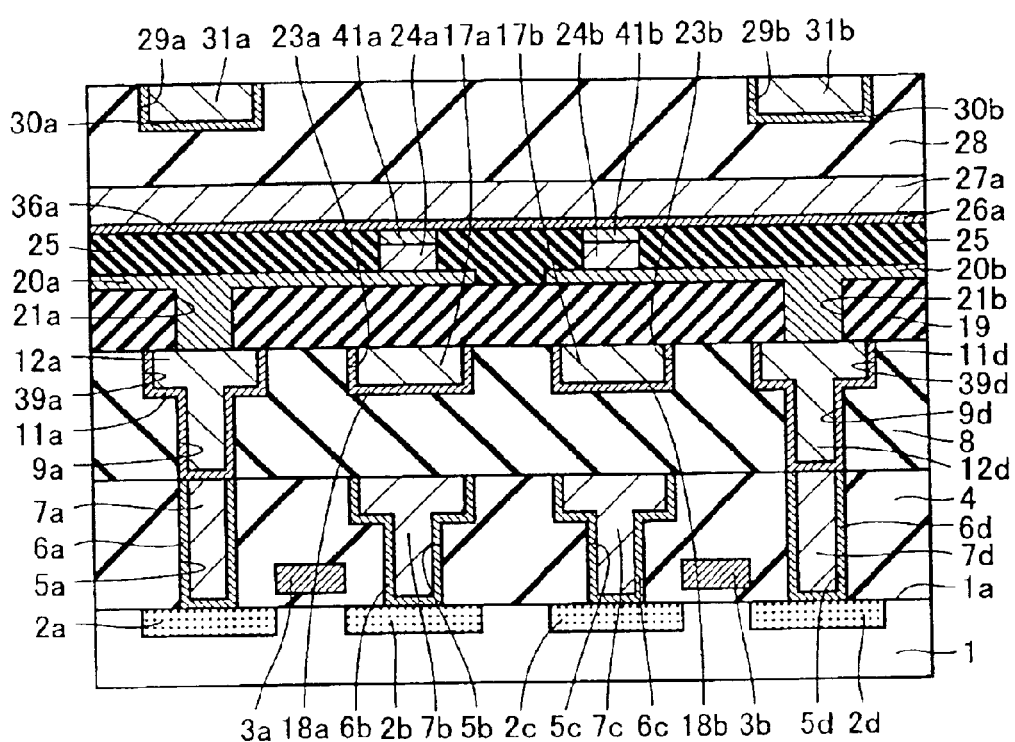

With reference to FIG. 29, interlayer insulating film 28 is formed by depositing a silicon oxide film on interlayer insulating film 40. Trenches 29a and 29b for wires are formed by performing a predetermined photolithographic process and an etching process on interlayer insulating film 28. After that, barrier metal film 30a and conductor film 31a as well as barrier metal film 30b and conductor film 31b, respectively, are formed so as to form wires inside of trenches 29a and 29b for wires.

With reference to FIG. 1, interlayer insulating film 32 is formed by depositing a silicon oxide film on interlayer insulating film 28. Trench 35 for a wire is formed by performing a predetermined photolithographic process and an etching process on interlayer insulating film 32. After that, barrier metal film 33 and conductor film 34, forming a wire inside of trench 35 for a wire, are formed. The thin film magnetic memory device shown in FIG. 1 is completed according to the above described process.

The manufacturing method for the thin film magnetic memory device according to the first embodiment of the present invention includes the steps of: depositing conductive material 20, as a conductor film, on main surface 1a of silicon substrate 1; depositing TMR lamination film 24, as a lamination film including a magnetic film, on conductive material 20; forming resist film 54 as a first mask film on TMR lamination film 24; etching a portion of TMR lamination film 24 and a portion of conductive material 20 using resist film 54 as a mask and, at the same time, leaving the other portions, thereby forming straps 20a and 20m, as first and second wires including conductive material 20, so as to extend in strip forms in the same direction and so as to be located at a predetermined distance away from each other and, at the same time, forming TMR lamination films 24 in the same strip forms as straps 20a and 20m on straps 20a and 20m; forming resist films 55, as a second mask film extending so as to intersect straps 20a and 20m, on TMR lamination films 24 in strip forms; and etching a portion of TMR lamination films 24 in strip forms using resist films 55 as a mask and leaving other portions, thereby forming TMR elements 24a and 24m, as magnetic memory cells operating as memory cells.

The manufacturing method for the thin film magnetic memory device further includes the step of isotropically etching TMR elements 24a and 24m so that the cross sections of TMR elements 24a and 24m in a plane parallel to main surface 1a of silicon substrate 1 become circular forms after the step of formation of TMR elements 24a and 24m.

According to the thin film magnetic memory device in such a configuration and according to the manufacturing method therefor, the buffer layers interposed between the bit lines and the TMR elements are formed into mesa forms. Therefore, the entirety of second surfaces 51 of buffer layers 41a and 41m can make contact with the bit lines formed in trenches 36a and 36b for wires, shown in FIG. 26, even in the case where trenches 36a and 36b for wires are formed in positions slightly shifted from buffer layers 41a and 41m as a result of the occurrence of error at the time of exposure for the formation of resist films 57, shown in FIG. 25. Thereby, the contact areas of the buffer layers and the bit lines can be maintained at a constant value at all times; therefore, the values of the resistances of the interfaces between the buffer layers and the bit lines can be stabilized so that a margin with respect to a read current can be increased. In addition, the characteristics of the memory cells can be prevented from being affected because the portions formed into mesa forms are buffer layers. A thin film magnetic memory device having a high reliability can be implemented due to the above described reasons.

In addition, the TMR elements are formed into elliptical forms at the same time as the step of forming the buffer layer into mesa forms. Thereby, the end domains in the free layers included in the TMR elements can be reduced. In the case where an end domain exists, the end domain causes a magnetic domain in a direction that differs from the direction in which the magnetic domains are oriented in the TMR element and becomes a factor that makes rewrite of data of the memory cell difficult. Such end domains may exist in a great number at an edge portion of an acute angle; therefore, the generation of end domains can be prevented by forming the TMR elements into elliptical forms. Thus, the switching magnetic field of a TMR element can be reduced by preventing the generation of end domains so that stable rewrite characteristics can be obtained in the memory cell.

In addition, the TMR lamination films are provisionally formed into the same forms as the straps, which are all formed utilizing resist films 54 as a mask, and, after that, the TMR lamination films are formed into the final forms of the TMR elements by utilizing other resist films 55. Therefore, the TMR elements can be formed without fail to have the same width as the straps and it is not necessary to take into account positioning error of the TMR elements due to mask shift. Thereby, the widths of the straps can be set at a small value so that miniaturization of the memory cells can be implemented.

In addition, at this time the TMR elements for the respective memory cells have already been separated by means of etching using resist films 54; therefore, resist films 55 can be formed into strip forms that extend across a plurality of memory cells. Thereby, the TMR elements can be formed so as to have highly precise forms.

That is to say, a microscopic resist pattern corresponding to the forms of the interval TMR elements must be formed in the case where the TMR elements are formed at the same time. In general, resist pattern dispersion generates in a photolithographic process. When dispersion in the edge portions of the form of the resist pattern, dependence on location and the effects of halation due to the difference in the density of the surrounding portion of the resist pattern are taken into consideration, the more microscopic the resist pattern becomes, the greater the above effects become. Therefore, short circuiting between adjacent TMR elements may occur when it is attempted to form the TMR elements at the same time using a microscopic resist pattern.

According to the present embodiment, resist films 54, which having the same forms as the straps, are great in size and, in addition, resist films 55 have strip forms extending across pluralities of memory cells; therefore, the microscopic process for forming TMR elements can be performed with a high precision. Thereby, the rewrite characteristics of the memory cells can be improved by preventing the generation of end domains and the resistance values in the TMR elements can be set at a constant value.

Second Embodiment

Figure 30:
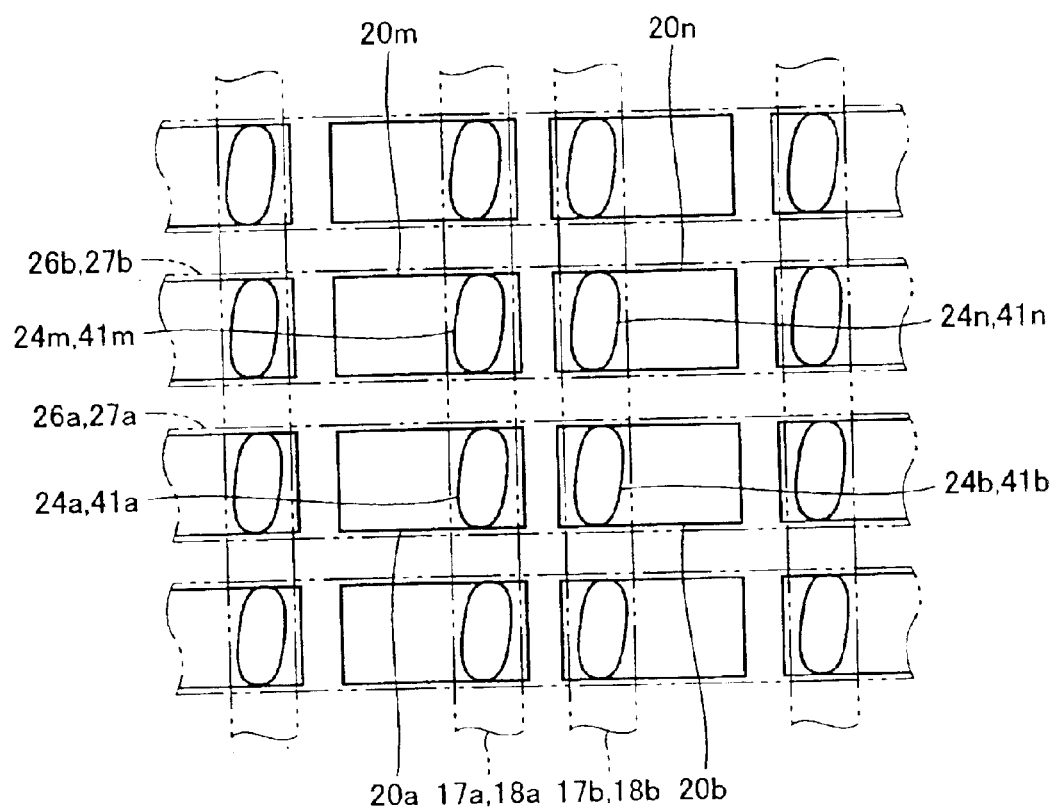
FIG. 30 is a plan view showing a thin film magnetic memory device according to a second embodiment of the present invention.

FIG. 30 specifically shows bit lines, digit lines, TMR elements, buffer layers and straps.

With reference to FIG. 30, the forms of TMR elements 24a, 24b, 24m and 24n as well as of buffer layers 41a, 41b, 41m and 41n in a thin film magnetic memory device according to a second embodiment differ from those in the thin film magnetic memory device of FIG. 1 according to the first embodiment. TMR elements 24a, 24b, 24m and 24n are formed into elliptical forms. The long axes of these elliptical forms are inclined relative to the direction in which the digit lines extend while the short axes of these elliptical forms are inclined relative to the direction in which the bit lines extend. Buffer layers 41a, 41b, 41m and 41n having the same elliptical forms as TMR elements 24a, 24b, 24m and 24n are formed on these TMR elements.

Figure 31:
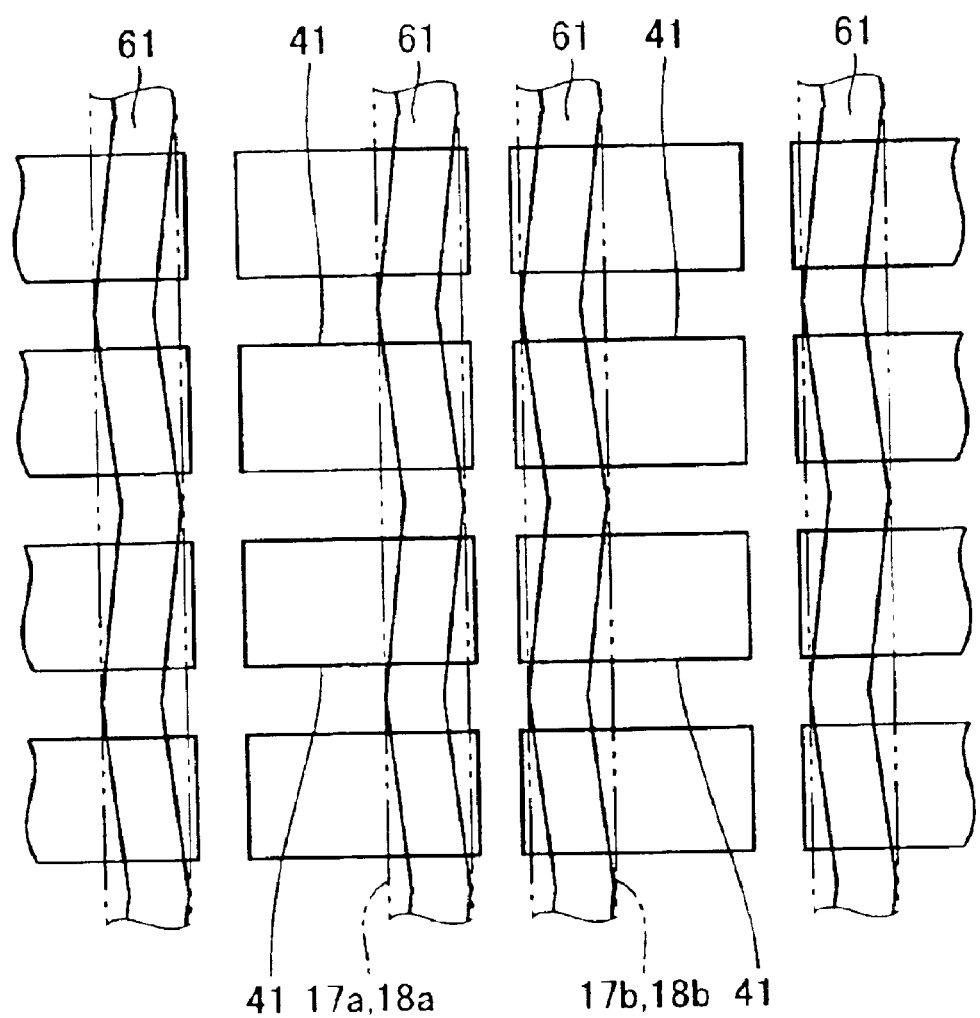
FIG. 31 is a plan view showing a step of a manufacturing method for the thin film magnetic memory device shown in FIG. 30.

The step of the manufacturing method for the thin film magnetic memory device according to the second embodiment shown in FIG. 31 is performed in place of the step of the manufacturing method for the thin film magnetic memory device according to the first embodiment shown in FIG. 16.

With reference to FIG. 31, resist films 61 are formed in regions on the top surfaces of interlayer insulating film 25 and conductive material 41 that overlap the first and second digit lines. Resist films 61 have cross sectional forms in a parallelepiped forms in regions that overlap conductive material 41, formed in strip forms. That is to say, the direction in which resist films 61 extend is inclined relative to the direction in which straps 20a, 20b, 20m and 20n, formed in the same forms as conductive material 41, extend beneath conductive material 41. In addition, resist films 61 extend across a plurality of pieces of conductive material 41.

In the case where resist films 61 having parallelepiped forms are utilized in the above described manner, the amount of retraction of TMR lamination film 24 due to isotropic etching in a corner portion of a parallelepiped form having a small internal angle is greater than that in a corner portion of a parallelepiped form having a large internal angle. Thereby, TMR elements 24a, 24b, 24m and 24n can be obtained having elliptical forms that are slightly inclined relative to the directions in which the bit lines and digit lines extend.

Resist films 61 as a second mask film intersect straps 20a and 20m as first and second wires at angles that are inclined relative to the direction in which resist films 61 extend according to the manufacturing method for the thin film magnetic memory device according to the second embodiment of the present invention.

The similar effects as the effects described in the first embodiment can be obtained according to the manufacturing method for the thin film magnetic memory device having the above described configuration. In addition, the areas of cross sections of the TMR elements can be increased in comparison with the first embodiment by using resist films 61 having predetermined forms. Thereby, the volumes of the magnetic bodies included in the TMR elements can be increased so that the TMR elements can be stabilized with respect to thermal agitation.

Herein, thermal agitation means a phenomenon that magnetic poles arbitrarily change direction due to the thermal energy received from the surroundings. Such effects from the thermal energy depend on the volumes of magnetic bodies included in the TMR elements wherein the greater are the volumes, the less easily are the effects from the thermal energy received. In addition, the relationship between the effects from the thermal energy and the volumes of the magnetic bodies is an exponential one and, therefore, effects due to thermal agitation can be greatly restricted through only slight increases in the areas of the cross sections of the TMR elements.

Third Embodiment

Figure 32:
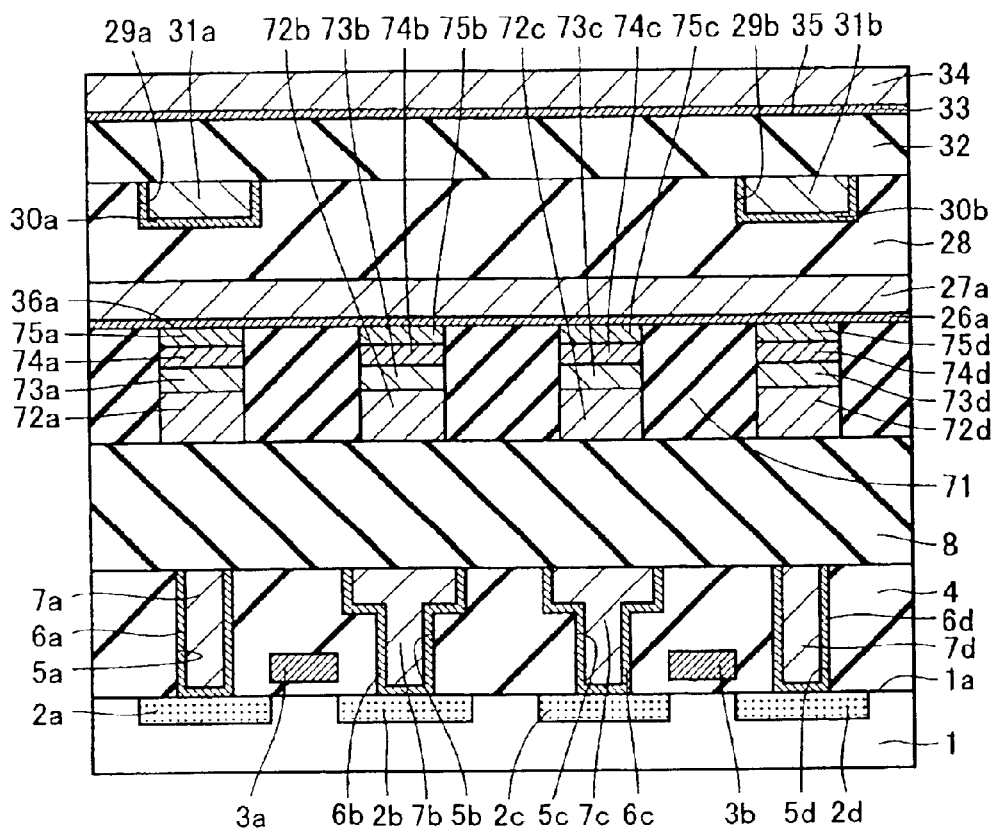
FIG. 32 is a cross sectional view showing a thin film magnetic memory device according to a third embodiment of the present invention.

Four cross point-type memory cells of an MRAM are formed in FIG. 32. In the following, the parts of the structure of the thin film magnetic memory device that are same as those in the first embodiment will not be repeatedly described or are briefly described.

With reference to FIG. 32, a decoder part is formed of field-effect transistors in a layer below interlayer insulating film 8 and a memory cell region of the MRAM is formed in a layer above interlayer insulating film 8. Transistors are not required in the case of cross point-type memory cells; therefore, the decoder part and the memory cell region can be formed in the same portion. Thereby, the size of the chip can be reduced and the efficiency of production of the device can be increased.

Conductor films 72a to 72d are formed on interlayer insulating film 8 so as to extend in the direction perpendicular to the surface of the paper of FIG. 32 and so as to be located at predetermined distances away from each other. Conductor films 72a to 72d are formed of a conductive material such as copper, aluminum, tungsten or titanium. Conductor films 72a to 72d form first to fourth digit lines in the memory cells of the MRAM.

Buffer layers 73a to 73d are formed on conductor films 72a to 72d, respectively. Buffer layers 73a to 73d are diodes for cell selection and are formed of lamination films of n-type silicon layers and p-type silicon layers. In addition, in the case where the cross point-type memory cells have configurations that do not include a diode, buffer layers 73a to 73d may be formed of a conductive material such as tantalum (Ta) or titanium (Ti).

TMR elements 74a to 74d are formed on buffer layers 73a to 73d, respectively. TMR elements 74a to 74d are formed of lamination films that include magnetic films such as of CoFe or NiFe. Buffer layers 75a and 75b made of a conductive material such as titanium or tantalum are formed on TMR elements 74a to 74d, respectively. Herein, in FIG. 32, the detailed forms of buffer layers 75a and 75b are not shown.

An interlayer insulating film 71 is formed of a silicon oxide film on interlayer insulating film 8. Interlayer insulating film 71 fills in the spaces between the above described lamination substances that are formed on interlayer insulating film 8 at predetermined distances away from each other. The top surface of interlayer insulating film 71 and the top surfaces of buffer layers 75a to 75d are provided in the same plane.

A first bit line is formed of conductor film 27a and barrier metal film 26a in interlayer insulating film 40, not shown, on interlayer insulating film 71. Barrier metal film 26a brings into contact with the top surfaces of buffer layers 75a to 75d. The first to fourth digit lines formed of conductor films 72a to 72d and the first bit line formed of conductor film 27a and barrier metal film 26a intersect at right angles with TMR elements 74a to 74d sandwiched therebetween. TMR elements 74a to 74d are formed at positions where the first to fourth digit lines and the first bit line intersect each other.

Figure 33:
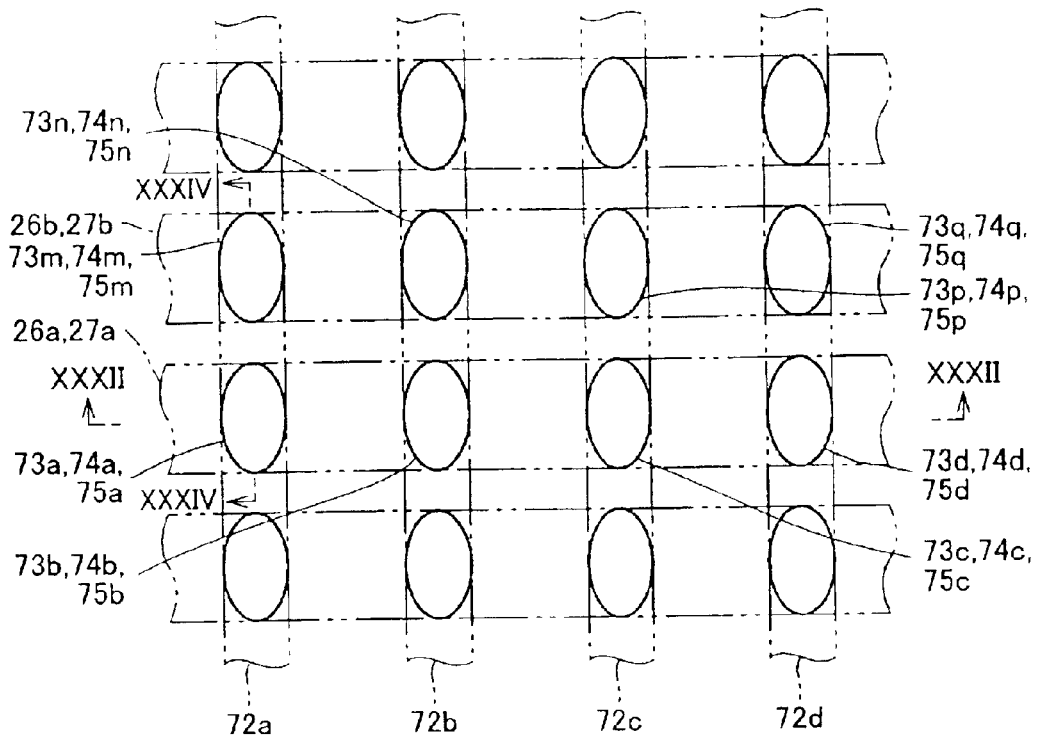
FIG. 33 is a plan view showing the thin film magnetic memory device of FIG. 32.
Figure 34:
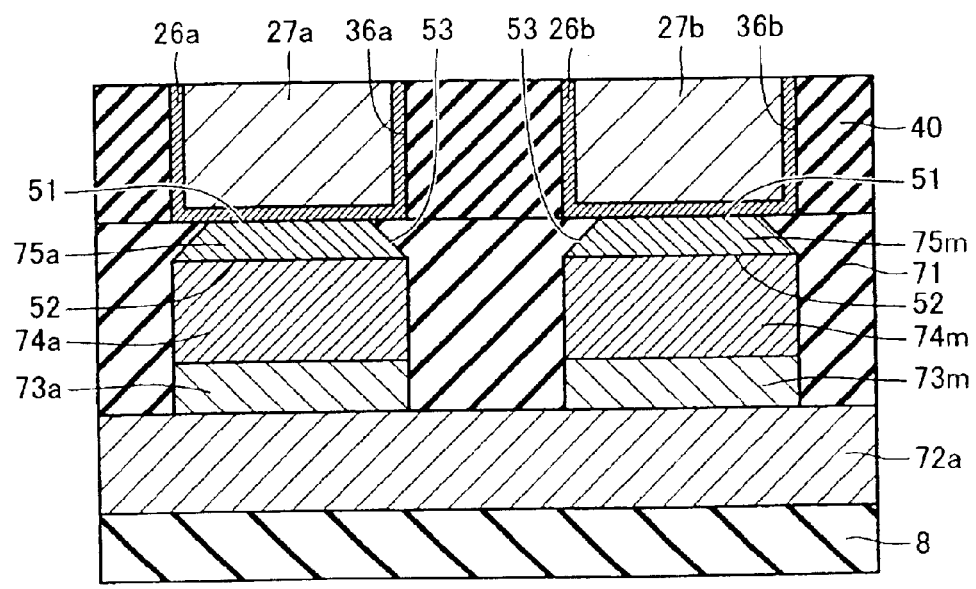
FIG. 34 is a cross sectional view taken along line XXXIV—XXXIV of FIG. 33.
Figure 35:
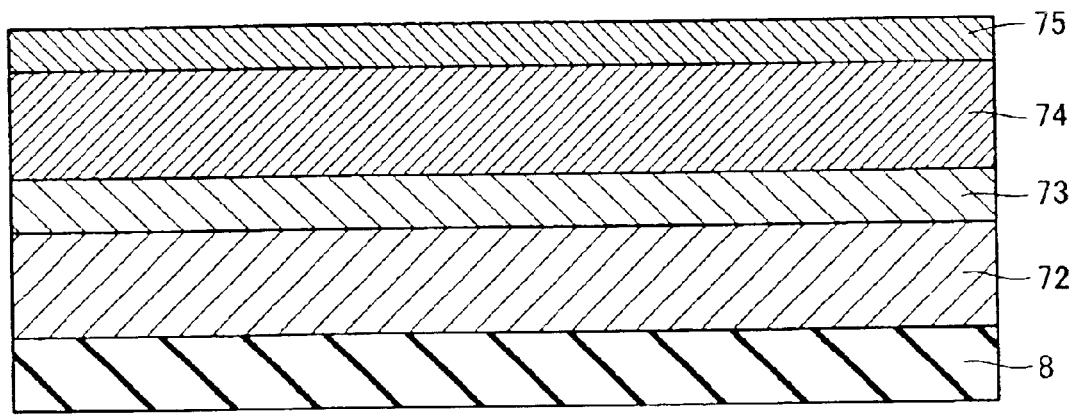
FIG. 35 is a cross sectional view showing a first step of a manufacturing method for the thin film magnetic memory device shown in FIG. 32.

FIG. 33 specifically shows bit lines, digit lines, TMR elements and buffer layers. FIG. 32 is a cross sectional view taken along line XXXII—XXXII of FIG. 33.

With reference to FIG. 33, the first bit line formed of conductor film 27a and barrier metal film 26a and a second bit line formed of conductor film 27b and barrier metal film 26b extend in the same direction and are located at a predetermined distance away from each other. The first to fourth digit lines formed of conductor films 72a to 72d extend in the direction perpendicular to the direction in which the first and second bit lines extend so as to be located at predetermined distances away from each other.

TMR elements 74a, 74b, 74c, 74d, 74m, 74n, 74p and 74q are arranged in a matrix form at positions where the first and second bit lines and the first to fourth digit lines intersect each other. In addition, buffer layers located above and below these TMR elements are similarly arranged. TMR elements 74a, 74b, 74c, 74d, 74m, 74n, 74p and 74q are formed into elliptical forms having their long axes extending in the direction in which the digit lines extend and having their short axes extending in the direction in which the bit lines extend. The lengths of the short axes of these elliptical forms are identical to the lengths of the digit lines in the direction in which the bit lines extend (hereinafter, also referred to as the width of a digit line). That is to say, TMR elements 74a, 74b, 74c, 74d, 74m, 74n, 74p and 74q are formed so as to have the same widths as the width of the first to fourth digit lines, respectively.

With reference to 34, interlayer insulating film 40, in which trenches 36a and 36 for wires are formed, is formed on interlayer insulating film 71. Buffer layers 75a and 75m have, similarly to buffer layers 41a and 41m shown in FIGS. 3 and 4: first surfaces 52 bringing into contact with TMR elements 74a or 74m; second surfaces 51, located on the side opposite to first surfaces 52, bringing into contact with barrier metal film 26a forming the first bit line or with barrier metal film 26b forming the second bit line; and inclined surfaces 53 that are continuous from first surfaces 52 to second surfaces 51. The areas of second surfaces 51 are smaller than the areas of first surfaces 52.

A manufacturing method for the thin film magnetic memory device shown in FIG. 32 will be described below with reference to FIGS. 35 to 52. Herein, although description will be given of the manufacturing process with reference to appropriate cross sectional views, the same manufacturing process is performed throughout the layer even in the cross sections that are not referred to. In addition, the steps of the manufacturing method for a thin film magnetic memory device that are the same as those in the first embodiment will be partially described.

With reference to 35, interlayer insulating film 8 is formed by depositing a silicon oxide film on interlayer insulating film 4 after the step shown in FIG. 5 in the first embodiment. Next, a conductive material 72, a silicon film 73, a TMR lamination film 74 and a conductive material 75 are sequentially deposited on top of interlayer insulating film 8.

Figure 36:
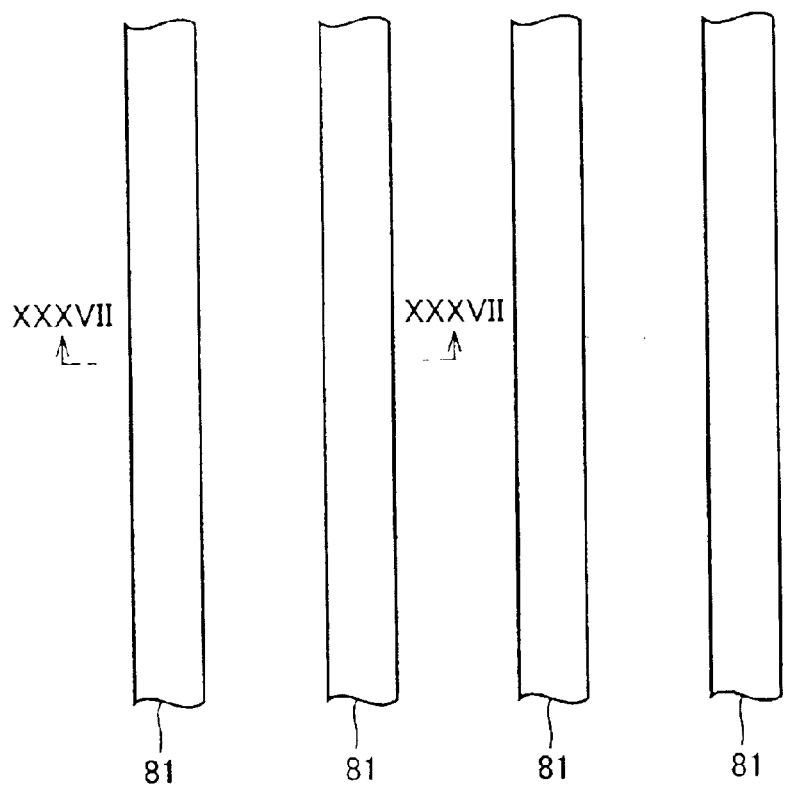
FIG. 36 is a plan view showing a second step of the manufacturing method for the thin film magnetic memory device shown in FIG. 32.
Figure 37:
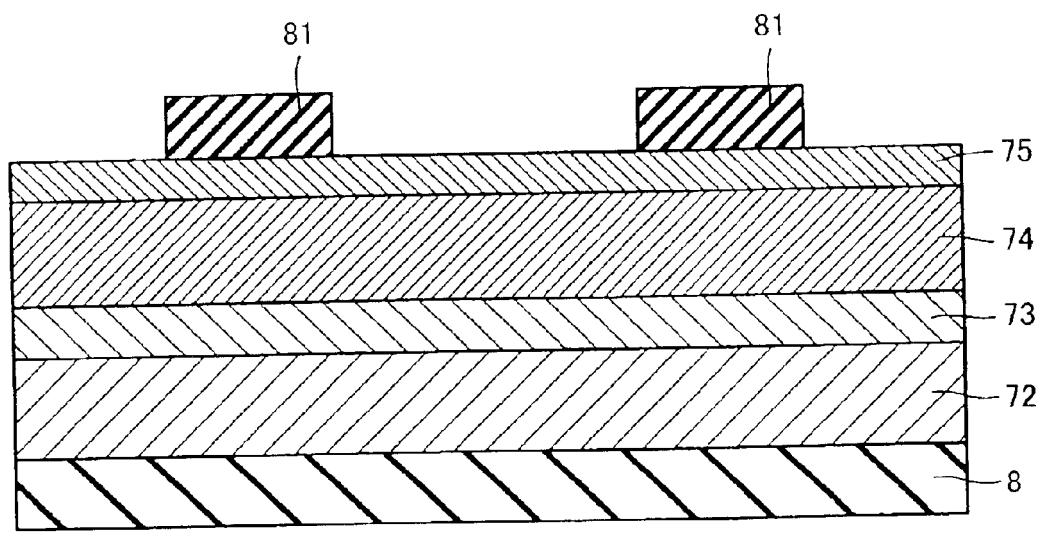
FIG. 37 is a cross sectional view taken along line XXXVII—XXXVII of FIG. 36.

With reference to FIGS. 36 and 37, resist films 81 in strip forms extending in one direction and are located at predetermined distances away from each other are formed on conductive material 75.

Figure 38:
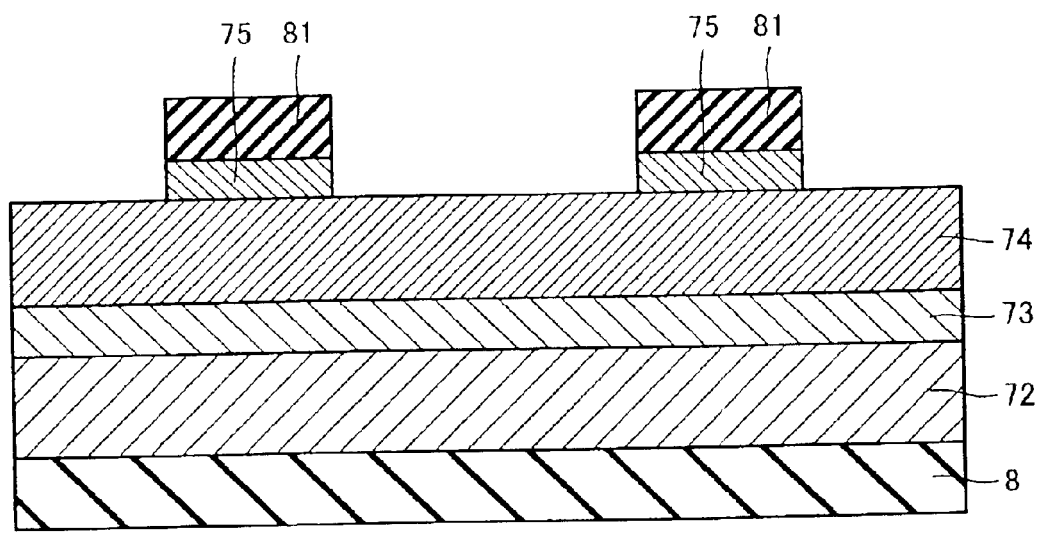
FIGS. 38 to 41 are cross sectional views showing third to sixth steps of the manufacturing method for the thin film magnetic memory device shown in FIG. 32.
Figure 39:
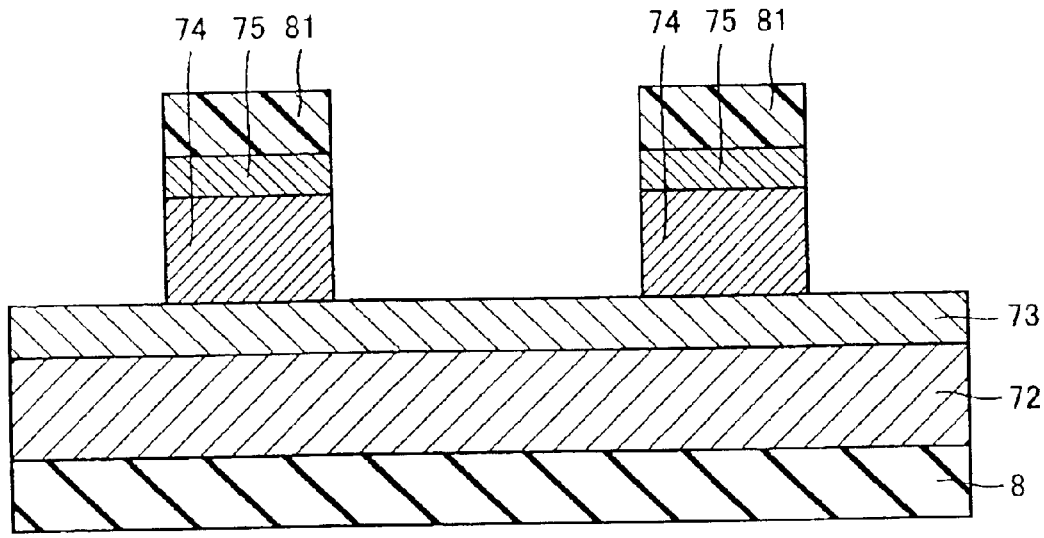
Figure 40:
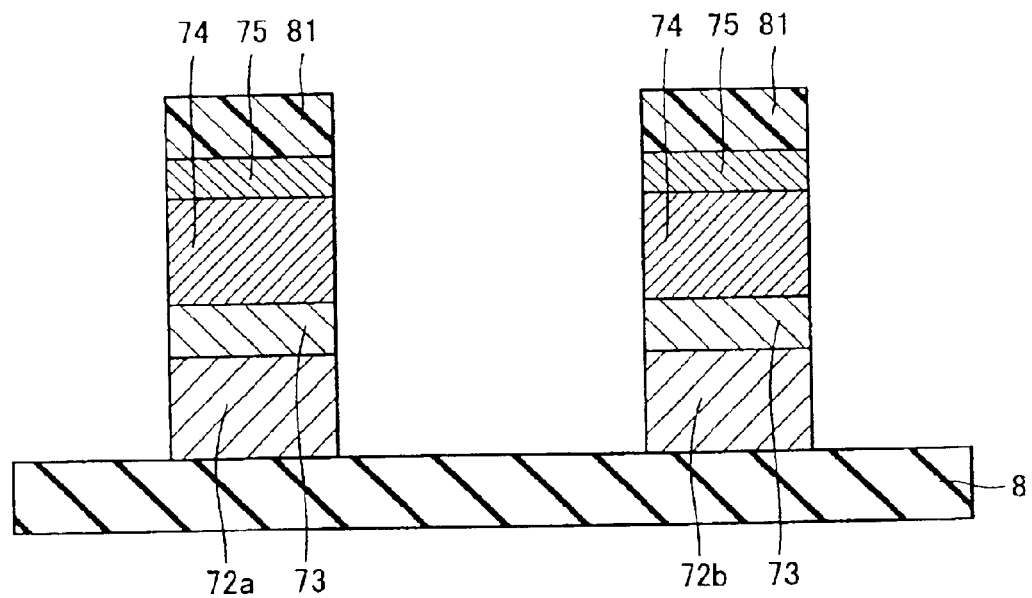

With reference to FIG. 38, conductive material 75 is etched using resist films 81 as a mask. With reference to FIG. 39, TMR lamination film 74 is etched using resist films 81 as a mask. With reference to FIG. 40, silicon film 73 is etched using resist films 81 as a mask. Conductor films 72a and 72b forming the first and second digit lines are formed by etching conductive material 72 using resist films 81 as a mask.

Resist films 81 are used as a mask in all of the steps shown in FIGS. 39 and 40, thereby forming the first and second digit lines in strip forms from conductive material 72 and, at the same time, provisionally forming TMR lamination film 74 and silicon film 73 in strip forms having the same forms as the first and second digit lines on the first and second digit lines.

Figure 41:
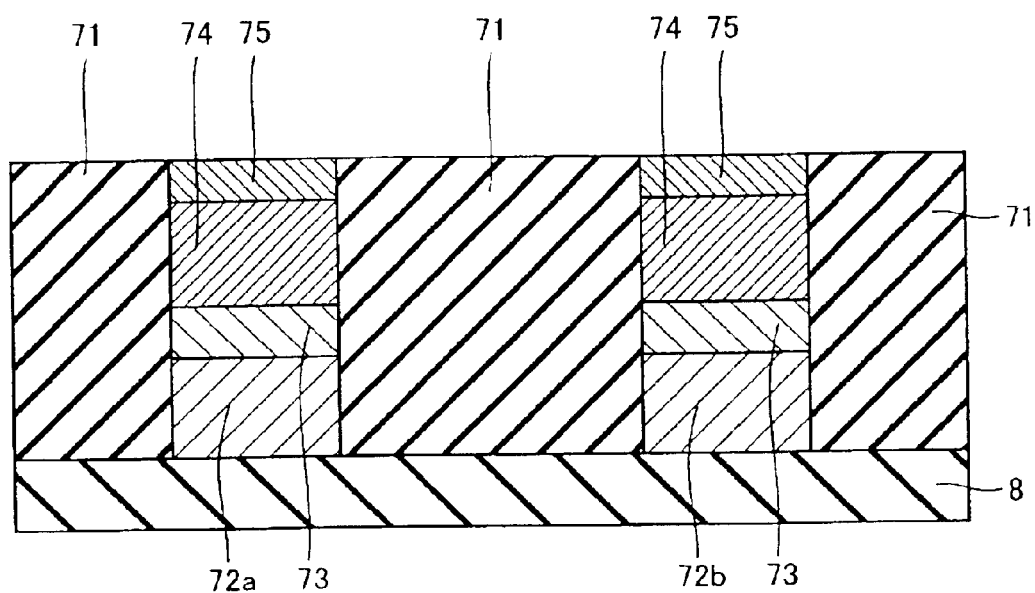

With reference to FIG. 41, resist film 81 is removed. Interlayer insulating film 71 is formed by depositing a silicon oxide film so as to fill in the trenches formed by means of etching in the steps shown in FIGS. 38 to 40 and so as to cover the top surface of conductive material 75. Interlayer insulating film 71 is removed by means of chemical mechanical polishing up to a level wherein the top surface of conductive material 75 is exposed.

Figure 42:
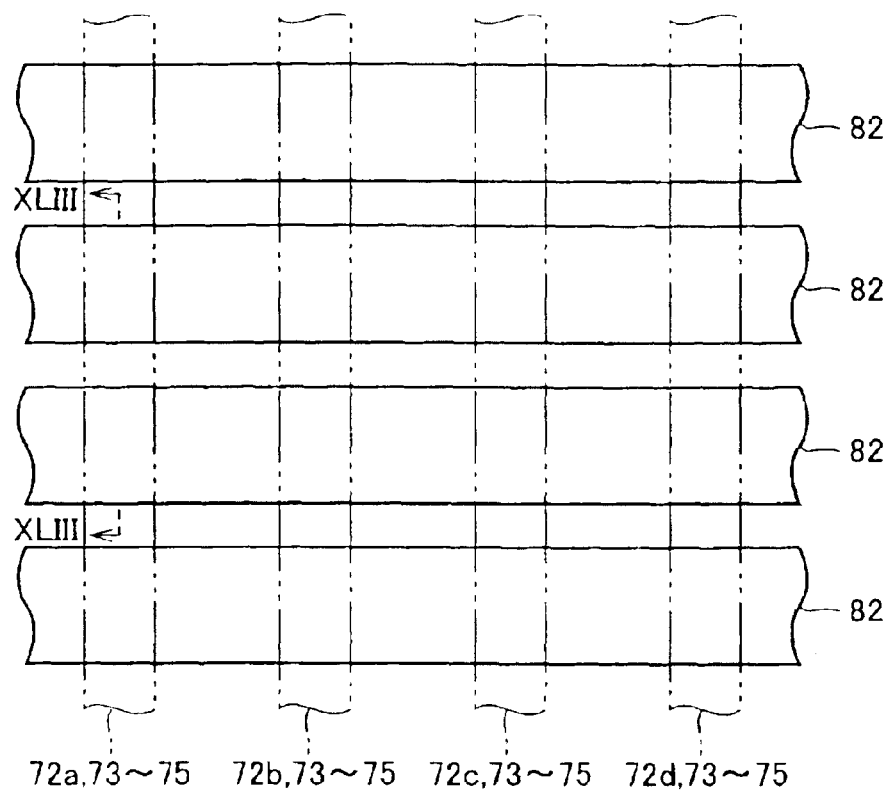
FIG. 42 is a plan view showing a seventh step of the manufacturing method for the thin film magnetic memory device shown in FIG. 32.
Figure 43:
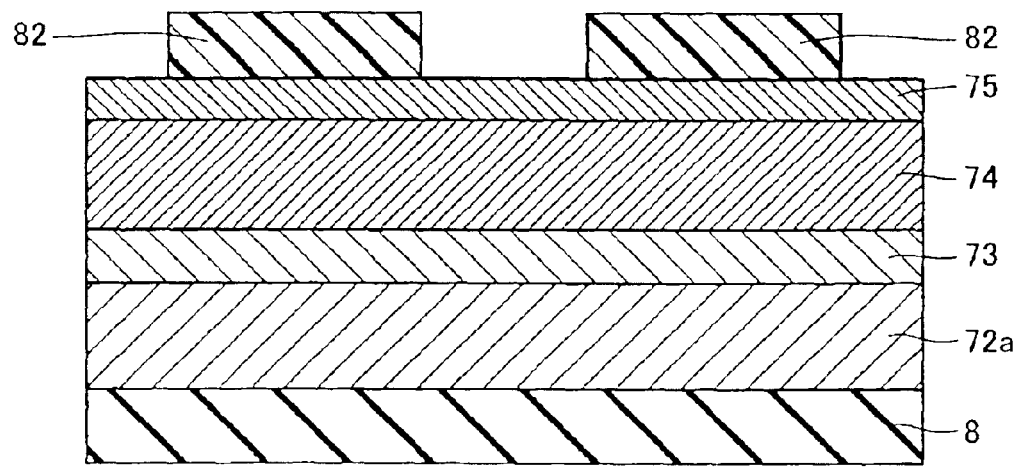
FIGS. 43 to 45 are cross sectional views showing seventh to ninth steps of the manufacturing method for the thin film magnetic memory device shown in FIG. 32.

FIG. 43 is a cross sectional view taken along line XLIII—XLIII of FIG. 42. With reference to FIGS. 42 and 43, resist films 82 are formed on the top surfaces of interlayer insulating film 71 and conductive material 75 so as to extend in the direction perpendicular to the direction in which conductive material 75 extends. Resist films 82 intersect resist films 81 formed in the step shown in FIG. 36 at right angles. In addition, resist films 82 extend across a plurality of pieces of conductive material 75.

Figure 44:
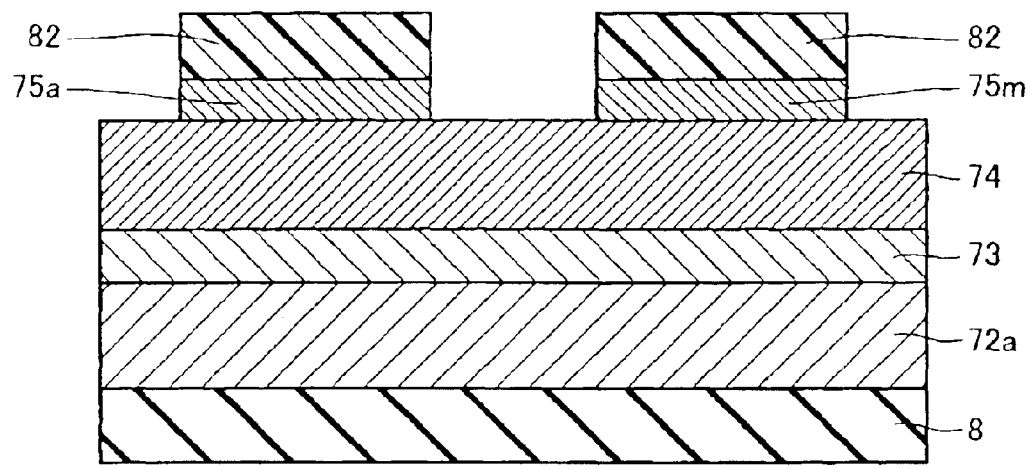
Figure 45:
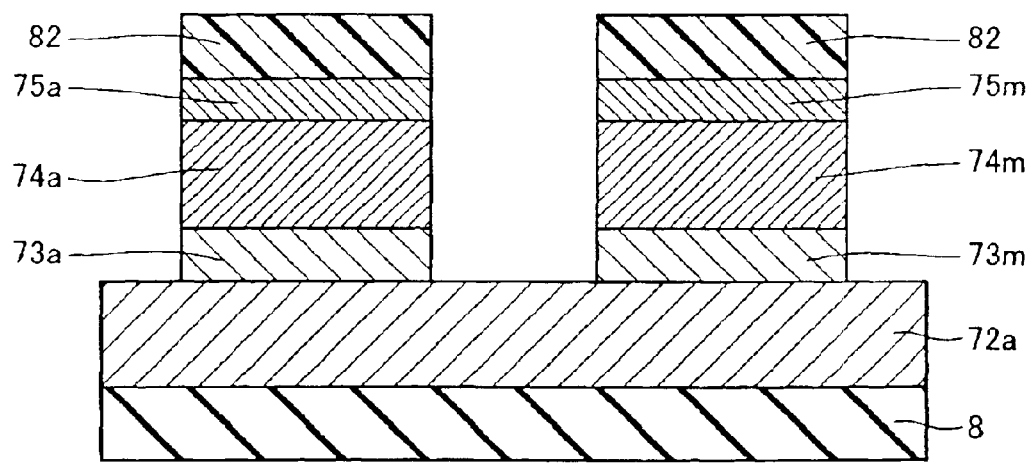

With reference to FIG. 44, buffer layers 75a and 75m are formed by etching conductive material 75 using resist films 82 as a mask. With reference to FIG. 45, TMR elements 74a and 74m are formed by etching TMR lamination film 74 using resist films 82 as a mask. Then, buffer layers 73a and 73m are formed by etching silicon film 73 using resist films 82 as a mask. At this point in time buffer layers 75a and 75m, TMR elements 74a and 74m as well as buffer layers 73a and 73m are formed into rectangular forms that partially cover the top surface of conductor film 72a forming the first digit line.

TMR lamination films 74 and silicon films 73 in strip forms are formed into TMR elements 74a and 74m as well as buffer layers 73a and 73m, respectively, in the step shown in FIG. 45, as described above. At this time, TMR elements and buffer layers having desired widths in the direction perpendicular to the direction in which the first digit line extends have already been formed by means of etching using resist films 81; therefore, a process may be performed so that TMR elements and buffer layers having desired widths in the direction in which the first digit line extends are formed by means of etching using resist films 82. Therefore, the sidewalls of TMR elements 74a and 74m as well as of buffer layers 73a and 73m and the sidewalls of conductor film 72a forming the first digit line, which have all been formed using resist films 81, are continuous in the same planes even after TMR elements 74a and 74m as well as buffer layers 73a and 73m are formed into their final forms.

Figure 46:
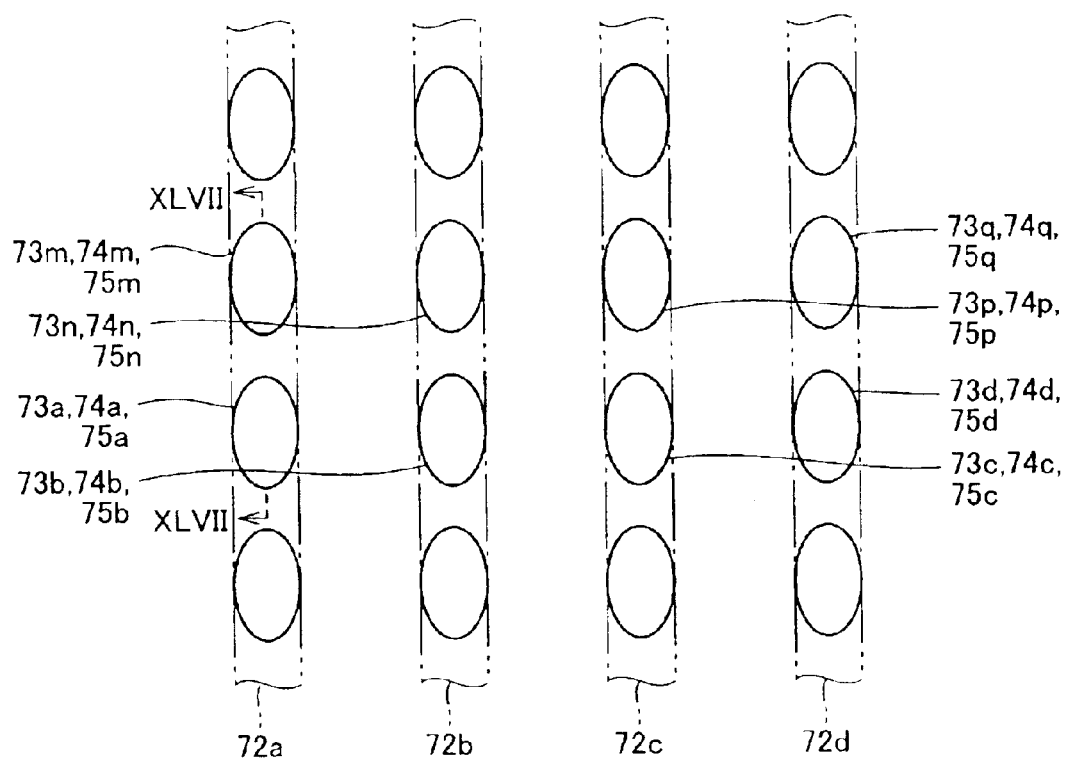
FIG. 46 is a plan view showing a tenth step of the manufacturing method for the thin film magnetic memory device shown in FIG. 32.
Figure 47:
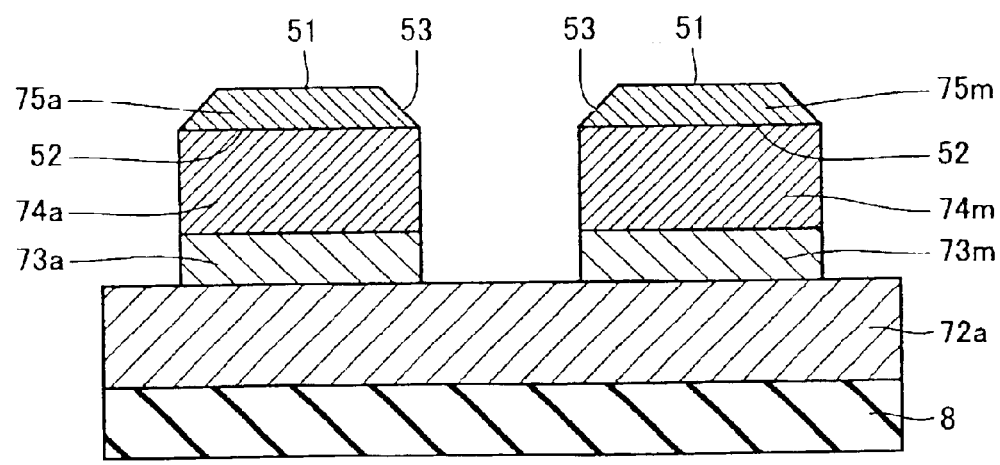
FIG. 47 is a cross sectional view taken along line XLVII—XLVII of FIG. 46.

With reference to FIGS. 46 and 47, resist films 82 are removed. The TMR elements and the respective buffer layers are isotropically etched using a predetermined etchant. Thereby, buffer layers 73a and 73m, TMR elements 74a and 74m as well as buffer layers 75a and 75m are formed into elliptical forms and, in addition, inclined surfaces 53 are formed in buffer layers 75a and 75m.

Figure 48:
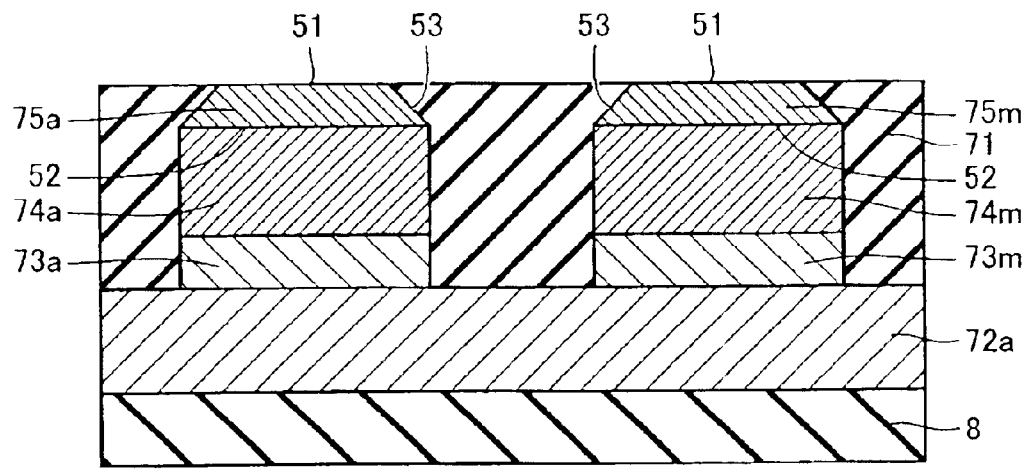
FIGS. 48 to 52 are cross sectional views showing eleventh to fifteenth steps of the manufacturing method for the thin film magnetic memory device shown in FIG. 32.

With reference to FIG. 48, interlayer insulating film 71 is again formed by depositing a silicon oxide film so as to fill in the trenches formed by means of etching in the steps shown in FIGS. 44 and 45 and so as to cover the top surfaces of buffer layers 75a and 75m. Buffer layers 75a and 75m are removed by means of chemical mechanical polishing up to a level where the top surfaces of buffer layers 75a and 75m are exposed.

Figure 49:
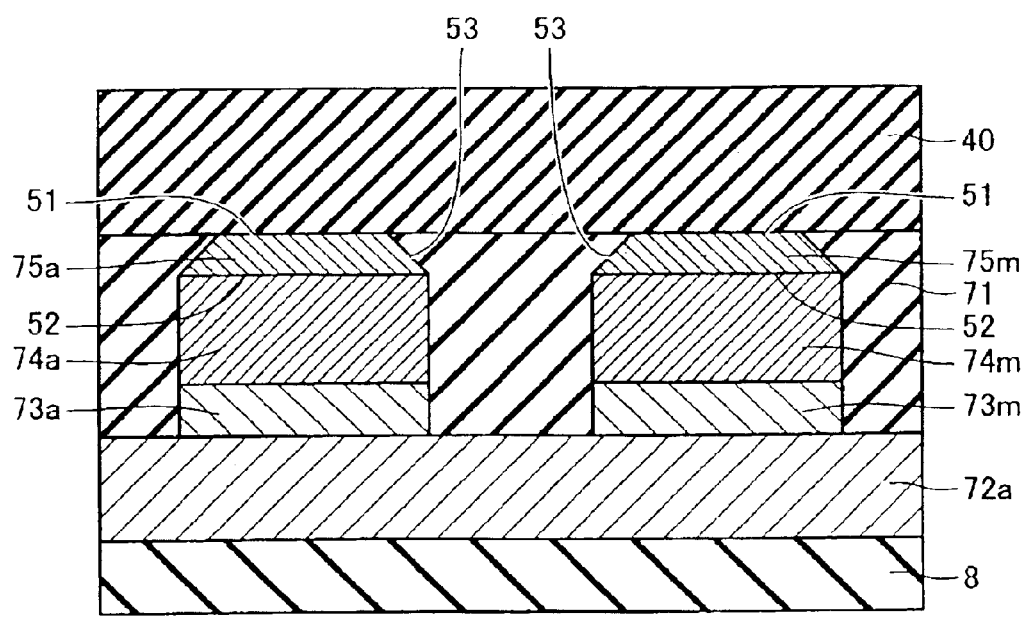
Figure 50:
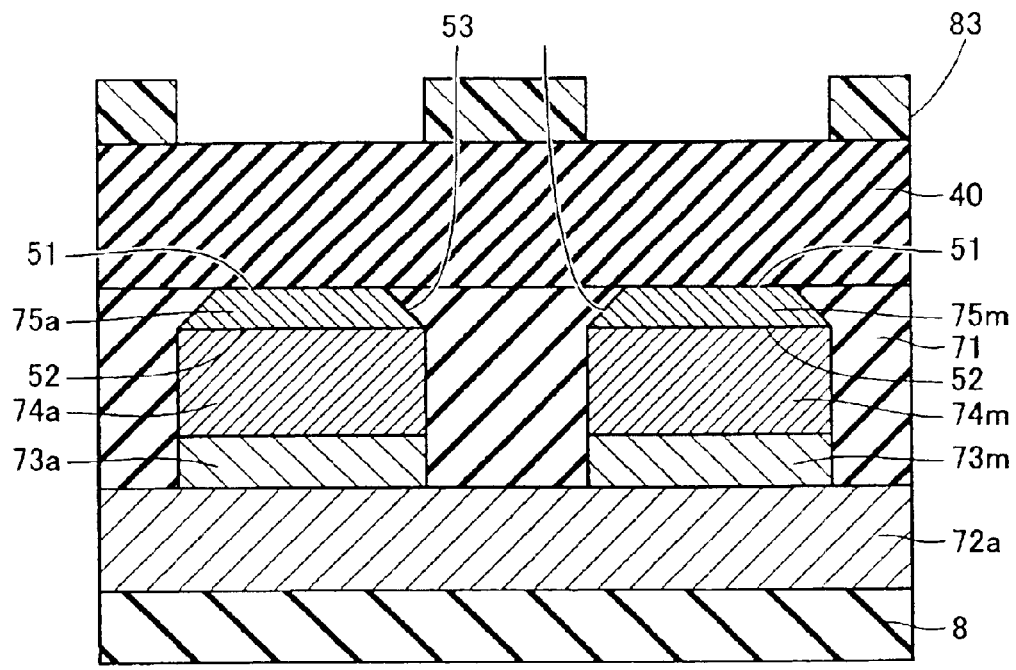
Figure 51:
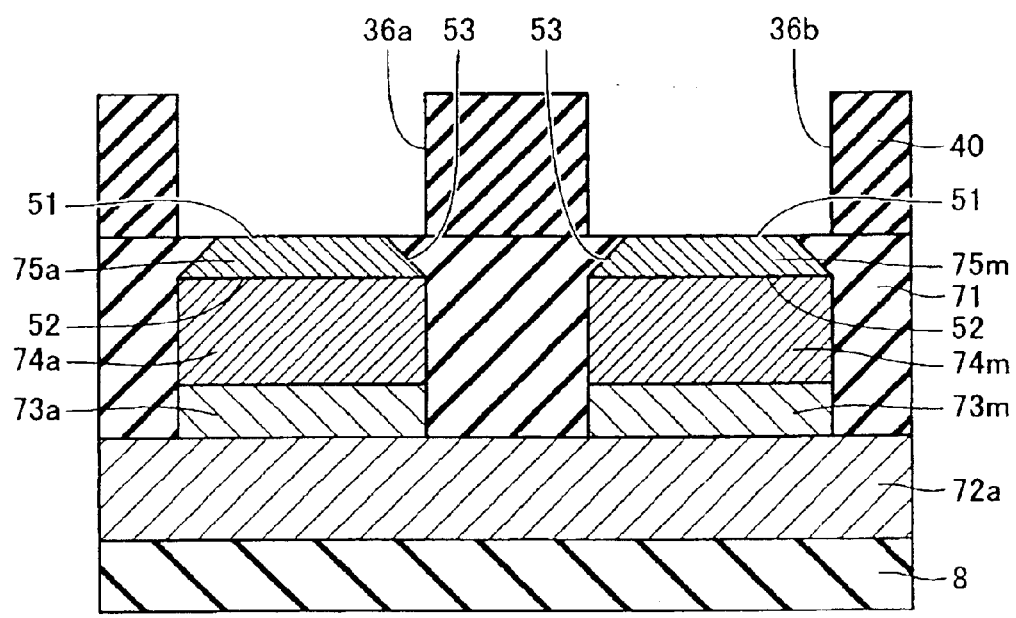

With reference to FIG. 49, interlayer insulating film 40 is formed by depositing a silicon oxide film on interlayer insulating film 71. With reference to FIG. 50, a resist film 83 having a pattern with predetermined openings is formed on interlayer insulating film 40. With reference to FIG. 51, interlayer insulating film 40 is etched using resist film 83 as a mask and, thereby, trenches 36a and 36b for wires are formed so as to reach to second surfaces 51 of buffer layers 75a and 75m. After that resist film 83 is removed.

Figure 52:
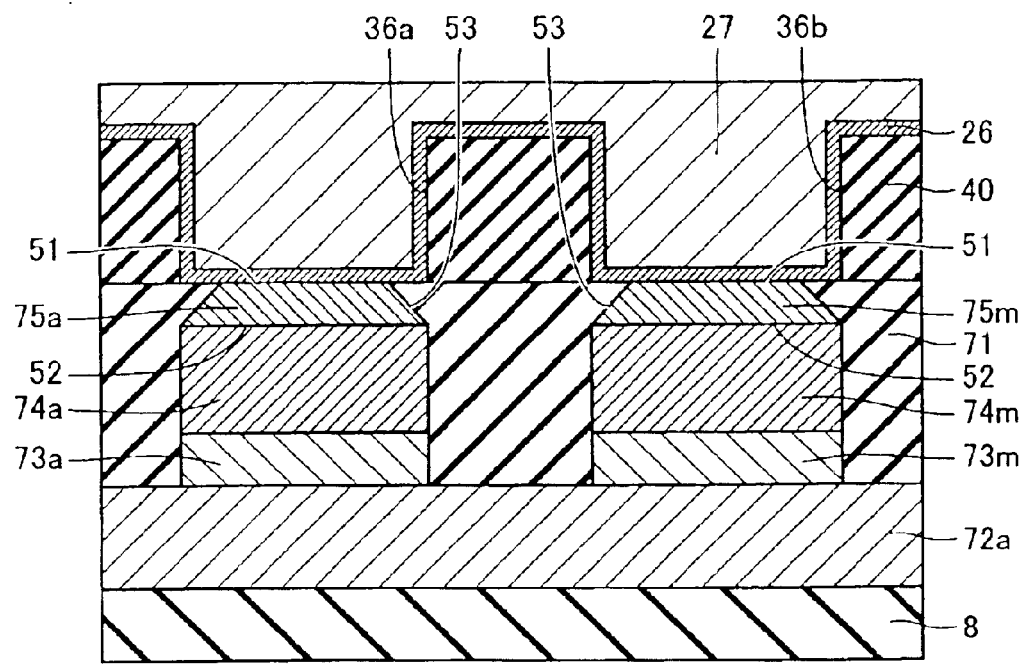

With reference to FIG. 52, barrier metal 26 and conductive material 27 are sequentially deposited inside of trenches 36a and 36b for wires and on the top surface of interlayer insulating film 40. After that, the steps shown in FIGS. 28, 29 and 1 in the first embodiment are performed. The above described steps result in the completion of the thin film magnetic memory device shown in FIG. 32.

The TMR lamination films are formed into the same forms as the digit lines, which are all formed utilizing resist films 81 as a mask, and, after that, the TMR lamination films are formed into the final forms of the TMR elements by utilizing other resist films 82 according to the thin film magnetic memory device of such a configuration and according to the manufacturing method for the same. Therefore, the TMR elements can be formed without fail to have the same width as the digit lines and it is not necessary to take into account positioning error of the TMR elements due to mask shift. Thereby, the widths of the digit lines can be set at a small value so that miniaturization of the memory cells can be implemented. Furthermore, the same effects as the effects described in the first embodiment, in addition to the above, can be obtained.

As described above, according to the present invention it is possible to provide a thin film magnetic memory device realizing miniaturization of the memory cells and, also, having a high reliability, and a manufacturing method therefor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
   a magnetic memory cell, provided on a main surface of a semiconductor substrate, operating as a memory element;
   a buffer layer having a first surface bringing into contact with said magnetic memory cell and a second surface, located on the side opposite to said first surface, having an area smaller than that of said first surface; and
   a wire extending in one direction so as to intersect said magnetic memory cell and so as to bring into contact with said second surface.

2. The thin film magnetic memory device according to claim 1, wherein
   said buffer layer contains at least one of titanium and tantalum.

3. The thin film magnetic memory device according to claim 1, wherein
   said buffer layer is formed so that the cross sectional area of said buffer layer in a plane parallel to the main surface of the semiconductor substrate becomes smaller as the position of the plane approaches said second surface, starting from said first surface.

4. The thin film magnetic memory device according to claim 1, wherein
   said magnetic memory cell is formed so that the cross section of the memory cell in a plane parallel to the main surface of the semiconductor substrate has a circular form.

* * * * *